(12) United States Patent
Itano et al.

(10) Patent No.: US 10,880,504 B2
(45) Date of Patent: Dec. 29, 2020

(54) IMAGE PICKUP DEVICE, IMAGE CAPTURING SYSTEM, AND MOVABLE BODY

(71) Applicant: CANON KABUSHIKI KAISHA, Tokyo (JP)

(72) Inventors: Tetsuya Itano, Sagamihara (JP); Shoji Kono, Hachioji (JP); Hideo Kobayashi, Tokyo (JP); Hiroyuki Morita, Ebina (JP); Yasuhiro Oguro, Tokyo (JP); Kei Ochiai, Inagi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 130 days.

(21) Appl. No.: 15/849,992

(22) Filed: Dec. 21, 2017

(65) Prior Publication Data
US 2018/0184018 A1    Jun. 28, 2018

(30) Foreign Application Priority Data

Dec. 27, 2016 (JP) .................. 2016-254390
Oct. 18, 2017 (JP) .................. 2017-202136

(51) Int. Cl.
| *H04N 5/355* | (2011.01) |
| *H04N 5/3745* | (2011.01) |
| *H04N 5/363* | (2011.01) |
| *H04N 5/235* | (2006.01) |
| *H04N 5/243* | (2006.01) |
| *H01L 27/146* | (2006.01) |

(52) U.S. Cl.
CPC ....... *H04N 5/355* (2013.01); *H01L 27/14643* (2013.01); *H04N 5/2352* (2013.01);
(Continued)

(58) Field of Classification Search
CPC .. H04N 5/355; H04N 5/37457; H04N 5/2352; H04N 5/35581; H04N 5/243;
(Continued)

(56) References Cited

U.S. PATENT DOCUMENTS

2011/0228152 A1* 9/2011 Egawa .................. H04N 5/243
                                                                      348/300
2012/0195502 A1    8/2012 Wang
2015/0350516 A1   12/2015 Rivard

FOREIGN PATENT DOCUMENTS

CN    1197348 A    10/1998
CN    1518724 A     8/2004
(Continued)

*Primary Examiner* — Nelson D. Hernández Hernández
(74) *Attorney, Agent, or Firm* — Canon U.S.A., Inc. IP Division

(57) ABSTRACT

An image pickup device according to an embodiment includes pixels each configured to output an analog signal based on electric charges produced in a photoelectric conversion unit and a control unit configured to control a gain applied to the analog signal to be at least a first gain and a second gain greater than the first gain in accordance with a signal value of the analog signal. Each of the pixels outputs, as the analog signal, a first signal and a second signal based on electric charges produced in the photoelectric conversion unit in a first exposure period and a second exposure period shorter than the first exposure period. The control unit controls the gain applied to the analog signal by selecting one from the first gain and the second gain in accordance with the signal value, for at least one of the first signal and the second signal.

35 Claims, 29 Drawing Sheets

(52) U.S. Cl.
CPC ........... *H04N 5/2355* (2013.01); *H04N 5/243* (2013.01); *H04N 5/35581* (2013.01); *H04N 5/363* (2013.01); *H04N 5/37455* (2013.01); *H04N 5/37457* (2013.01)

(58) Field of Classification Search
CPC .. H04N 5/2355; H04N 5/363; H04N 5/37455; H04N 5/378; H04N 5/341; H01L 27/14643
See application file for complete search history.

(56) References Cited

FOREIGN PATENT DOCUMENTS

| | | |
|---|---|---|
| CN | 101394482 A | 3/2009 |
| CN | 102143325 A | 8/2011 |
| CN | 102449997 A | 5/2012 |
| CN | 102625060 A | 8/2012 |
| CN | 103945145 A | 7/2014 |
| CN | 104580945 A | 4/2015 |
| CN | 105046668 A | 11/2015 |
| CN | 105872148 A | 8/2016 |
| EP | 1924085 A2 | 5/2008 |
| JP | H07-115643 A | 5/1995 |
| JP | 2004-363666 A | 12/2004 |
| JP | 2008-124842 A | 5/2008 |
| JP | 2008-167004 A | 7/2008 |
| JP | 2009-177797 A | 8/2009 |
| JP | 2013-236362 A | 11/2013 |
| WO | 2012/043867 A1 | 4/2012 |
| WO | 2015/183693 A1 | 12/2015 |

\* cited by examiner

IMAGE PICKUP DEVICE, IMAGE CAPTURING SYSTEM, AND MOVABLE BODY

BACKGROUND OF THE INVENTION

Field of the Invention

The present invention relates to an image pickup device, an image capturing system, and a movable body.

Description of the Related Art

It is known that a variable conversion gain is applied to a pixel signal generated by each pixel in order to implement a wide dynamic range in image pickup devices including analog-to-digital (AD) conversion units. In Japanese Patent Laid-Open No. 2013-236362, a configuration is described in which pixel signals are amplified using different gains in accordance with levels (signal values) of the pixel signals, and then AD conversion is performed on the amplified pixel signals. In addition, in Japanese Patent Laid-Open No. 2009-177797, a configuration is described in which an amount of change in a ramp signal supplied to a comparator of each AD conversion unit is changed in accordance with the level of a pixel signal.

SUMMARY OF THE INVENTION

An aspect of the present invention provides an image pickup device including a plurality of pixels each configured to output an analog signal based on electric charges produced in a photoelectric conversion unit, and a control unit configured to control a gain applied to the analog signal to be at least a first gain and a second gain greater than the first gain in accordance with a signal value of the analog signal. Each of the plurality of pixels outputs, as the analog signal, a first signal based on electric charges produced in the photoelectric conversion unit in a first exposure period and a second signal based on electric charges produced in the photoelectric conversion unit in a second exposure period shorter than the first exposure period. The control unit controls the gain applied to the analog signal by selecting one from the first gain and the second gain in accordance with the signal value, for at least one of the first signal and the second signal.

Another aspect of the present invention provides an image pickup device including a plurality of pixels each configured to output an analog signal based on electric charges produced in a photoelectric conversion unit, and a control unit configured to control a gain applied to the analog signal to be at least a first gain and a second gain greater than the first gain. Each of the plurality of pixels outputs, as the analog signal, a first signal based on electric charges produced in the photoelectric conversion unit in a first exposure period and a second signal based on electric charges produced in the photoelectric conversion unit in a second exposure period shorter than the first exposure period. The control unit controls the gain applied to the first signal to be the first gain when a signal value of the first signal is in a first range. The control unit controls the gain applied to the first signal to be the second gain when the signal value of the first signal is in a second range located on a lower luminance side than the first range. The control unit controls the gain applied to the second signal to be the first gain in the case when a signal value of the second signal is in the first range and in the case when the signal value of the second signal is in the second range.

Another aspect of the present invention provides an image pickup device including a plurality of pixels each configured to output an analog signal based on electric charges produced in a photoelectric conversion unit, and a control unit configured to control a gain applied to the analog signal to be at least a first gain and a second gain greater than the first gain in accordance with a result of comparison between a signal value of the analog signal and a threshold. Each of the plurality of pixels outputs, as the analog signal, a first signal based on electric charges produced in the photoelectric conversion unit in a first exposure period and a second signal based on electric charges produced in the photoelectric conversion unit in a second exposure period shorter than the first exposure period. A threshold used in the comparison performed for the first signal is different from a threshold used in the comparison performed for the second signal.

Another aspect of the present invention provides an image pickup device including a plurality of pixels each configured to output an analog signal based on electric charges produced in a photoelectric conversion unit, an analog-to-digital conversion unit including a comparison circuit and configured to convert the analog signal into a digital signal, and a reference signal generation circuit configured to supply a reference signal to the comparison circuit. Each of the plurality of pixels outputs, as the analog signal, a first signal based on electric charges produced in the photoelectric conversion unit in a first exposure period and a second signal based on electric charges produced in the photoelectric conversion unit in a second exposure period shorter than the first exposure period. When at least one of the first signal and the second signal is converted into the digital signal, an amount of change per unit time in a signal value of the reference signal supplied to the comparison circuit is changed in accordance with the signal value of the analog signal.

Further features of the present invention will become apparent from the following description of exemplary embodiments with reference to the attached drawings.

DESCRIPTION OF THE EMBODIMENTS

In image pickup devices, the level (signal value) of a pixel signal may reach a saturation level in a photoelectric conversion unit or a pixel circuit. The level (signal value) of a pixel signal may fall below a noise level in a photoelectric conversion unit or a pixel circuit. Thus, when luminance changes greatly over a subject, a sufficiently fine gradation level is not obtained for a bright or dark portion in some cases. That is, implementing a sufficiently wide dynamic range is difficult. However, according to some embodiments, an image pickup device capable of applying a plurality of gains to pixel signals is able to implement a wide dynamic range.

First Embodiment

Figure 1:
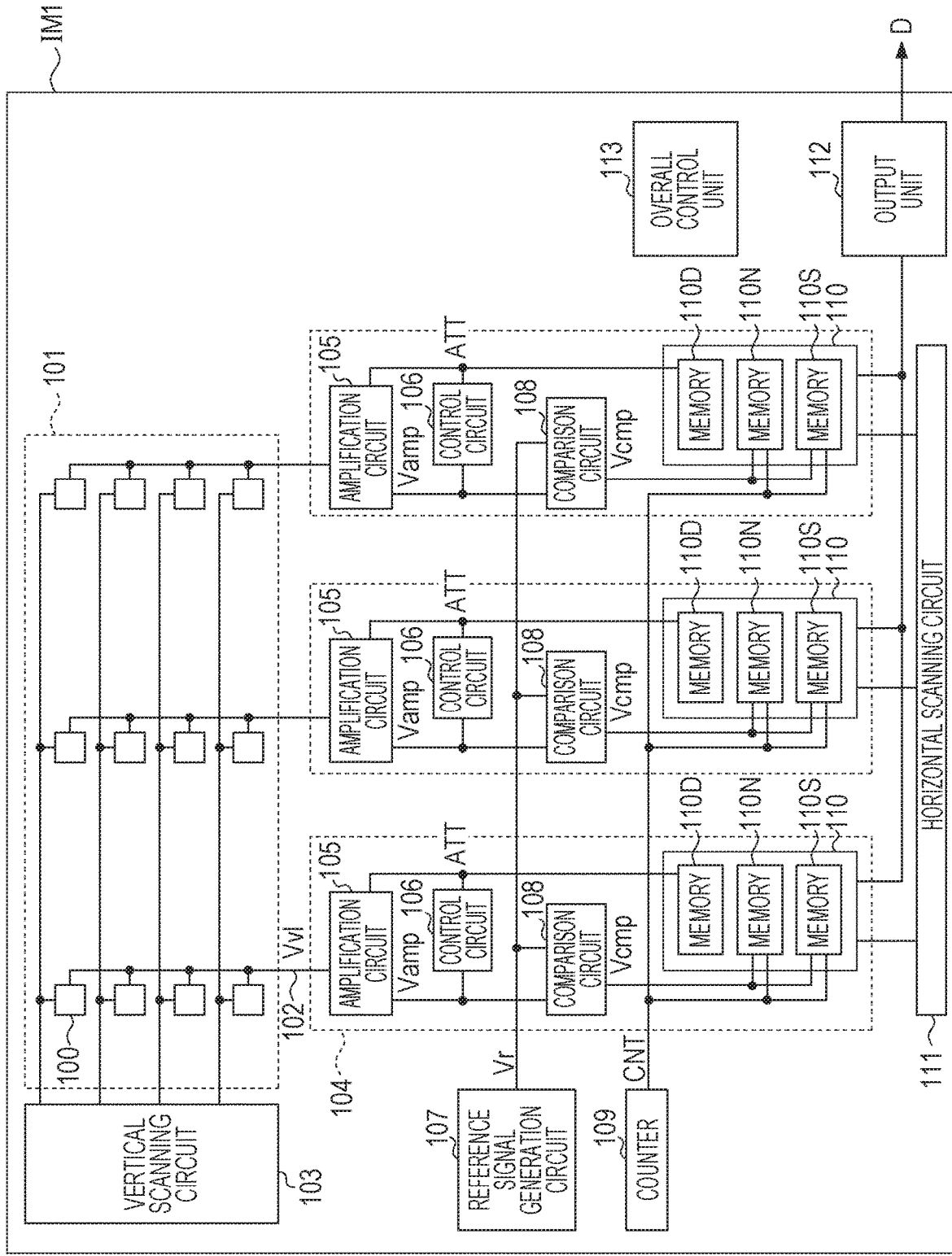
FIG. 1 is a diagram schematically illustrating an overall configuration of an image pickup device.

A configuration of an image pickup device IM1 according to a first embodiment will be described with reference to a circuit block diagram of FIG. 1. FIG. 1 illustrates components included in the image pickup device IM1. The image pickup device IM1 includes a pixel array 101 including a plurality of pixels 100 arranged in a matrix. FIG. 1 illustrates the pixel array 101 including the pixels 100 arranged in four rows and three columns by way of example. Note that the pixel arrangement in the pixel array 101 is not limited to this example. Each of the pixels 100 generates a pixel signal based on light that is incident thereto. In addition, each of the pixels 100 generates a reset level signal based on a reset state thereof.

The pixels 100 constituting a row are connected to a common control line. A vertical scanning circuit 103 supplies a control signal for controlling an operation of the pixels 100 to the pixels 100 through the corresponding control line. In addition, the pixels 100 constituting a column are connected to an output line 102 in common. An analog signal supplied to each column signal processing unit 104 through the corresponding output line 102 is referred to as an output line signal Vvl. For example, when a pixel signal is read from the pixel 100 to the output line 102, the output line signal Vvl has a signal value based on the pixel signal. In addition, when a reset level signal is read from the pixel 100 to the output line 102, the output line signal Vvl has a signal value based on the reset level signal. That is, a pixel signal and a reset level signal output from each of the pixels 100 to the corresponding output line 102 are collectively referred to as the output line signals Vvl. Each of the output lines 102 is connected to the corresponding one of the column signal processing units 104. The plurality of column signal processing units 104 are each provided for a corresponding one of the plurality of columns.

Each of the column signal processing units 104 includes an amplification circuit 105, a control circuit 106, a comparison circuit 108, and a memory unit 110.

The amplification circuit 105 amplifies the output line signal Vvl to generate an amplified signal Vamp and supplies the amplified signal Vamp to the control circuit 106 and the comparison circuit 108. Types of the amplified signal Vamp include an amplified pixel signal and an amplified reset level signal. As described later, the amplification circuit 105 amplifies the output line signal Vvl using one of a plurality of gains to generate the amplified signal Vamp. That is, the amplification circuit 105 has a variable gain.

The control circuit 106 compares the signal value of the amplified signal Vamp with a predetermined threshold Vth. The control circuit 106 supplies a determination signal ATT based on the comparison result to the amplification circuit 105 and the memory unit 110. For example, the control circuit 106 according to the first embodiment sets the determination signal ATT to a low level (L level) when the signal value of the amplified signal Vamp is less than the threshold Vth and sets the determination signal ATT to a high level (H level) when the signal value of the amplified signal Vamp is greater than the threshold Vth. The amplification circuit 105 changes the gain used for amplification of the output line signal Vvl in accordance with the level of the determination signal ATT. That is, the control circuit 106 determines whether the amplification circuit 105 is to change the gain. The gain is changed while the amplification circuit 105 is amplifying the pixel signal (the output line signal Vvl) output to the output line 102.

The comparison circuit 108 is supplied with the amplified signal Vamp from the amplification circuit 105 and a reference signal Vr from a reference signal generation circuit 107. The reference signal generation circuit 107 outputs a ramp signal serving as the reference signal Vr, in accordance with an instruction given thereto from an overall control unit 113. A ramp signal is a signal whose signal value changes at a certain amount with respect to time.

The comparison circuit 108 compares the amplified signal Vamp with the reference signal Vr and supplies a comparison signal Vcmp indicating the comparison result to the memory unit 110. For example, the comparison circuit 108 according to the first embodiment sets the comparison signal Vcmp to the L level when the signal value of the amplified signal Vamp is greater than the signal value of the reference signal Vr and sets the comparison signal Vcmp to the H level when the signal value of the amplified signal Vamp is less than the signal value of the reference signal Vr.

In addition to the determination signal ATT supplied from the control circuit 106 and the comparison signal Vcmp supplied from the comparison circuit 108, the memory unit 110 is supplied with a count signal CNT from a counter 109. The counter 109 counts up or down a count value represented by the count signal CNT as time passes, in accordance with an instruction given thereto from the overall control unit 113. The memory unit 110 includes a memory 110S, a memory 110N, and a memory 110D. Each of the memory 110S, the memory 110N, and the memory 110D stores a digital signal of at least one bit. The memory 110D stores the level of the determination signal ATT supplied from the control circuit 106. The determination signal ATT is a digital signal that takes binary values, that is, the H level and the L level. Each of the memory 110S and the memory 110N stores a difference between the count value represented by the count signal CNT corresponding to a timing at which the reference signal generation circuit 107 has started supplying the ramp signal and the count value represented by the count signal CNT corresponding to a timing at which the level of the comparison signal Vcmp has switched. This difference is usually represented as a digital signal of a plurality of bits. Thus, each of the memory 110N and the memory 110D is desirably capable of storing a digital signal of a plurality of bits.

The memory 110N stores a digital signal converted from the amplified signal Vamp that is output by the amplification circuit 105 in a state where the pixel 100 is reset. That is, the memory 110N stores a digital signal converted from a reset level signal. The memory 110S stores a digital signal converted from the amplified signal Vamp that is output by the amplification circuit 105 in a state where a pixel signal is read from the pixel 100. That is, the memory 110S stores a digital signal converted from a pixel signal. A pixel signal is a signal based on electric charges produced in a photoelectric conversion unit of the pixel 100.

The reference signal generation circuit 107, the comparison circuit 108, the counter 109, and the memory unit 110 constitute an analog-to-digital conversion unit (hereinafter, referred to as an AD conversion unit) that converts the amplified signal Vamp into a digital signal. Types of the digital signal generated by the AD conversion unit include a digital signal converted from a pixel signal and a digital signal converted from a reset level signal.

Each of the column signal processing units 104 is provided for a corresponding one of the output lines 102. In the first embodiment, the single reference signal generation circuit 107 and the single counter 109 are provided for the plurality of column signal processing units 104 in common. Alternatively, the reference signal generation circuit 107 and the counter 109 may be provided separately for each of the plurality of column signal processing units 104.

A horizontal scanning circuit 111 sequentially reads the digital signals from the plurality of memory units 110 to an output unit 112. The output unit 112 outputs the digital signals to outside of the image pickup device IM1. The output unit 112 may perform subtraction processing on a digital signal converted from a reset level signal and a digital signal converted from a corresponding pixel signal.

The overall control unit 113 supplies control signals (described later) to the individual components of the image pickup device IM1 to control operations of the components.

Examples of circuit configurations of each of the pixels 100, the amplification circuit 105, and the control circuit 106 illustrated in FIG. 1 will be described next with reference to FIGS. 2 to 4.

Figure 2:
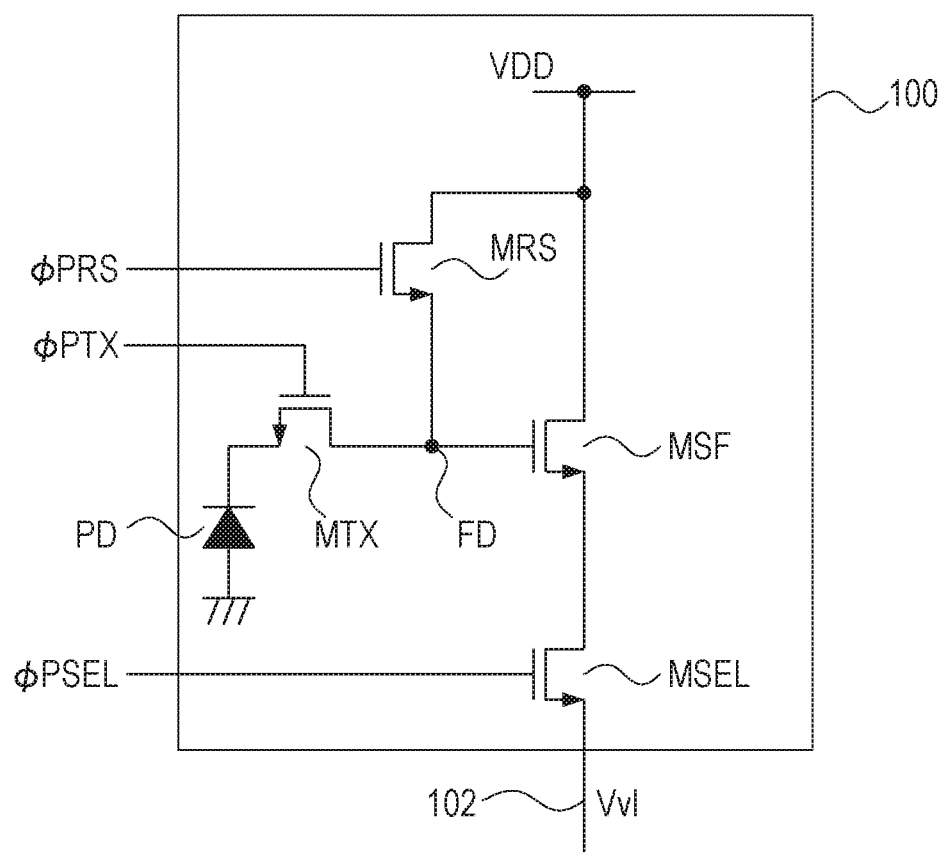
FIG. 2 is a diagram illustrating an equivalent circuit of a pixel of the image pickup device.

FIG. 2 illustrates an equivalent circuit of the pixel 100. The pixel 100 includes a photodiode PD, an amplification transistor MSF, a transfer transistor MTX, a reset transistor MRS, and a selection transistor MSEL. The transfer transistor MTX, the reset transistor MRS, and the selection transistor MSEL are controlled to be in a conducting state or a non-conducting state in accordance with control signals $\phi$PTX, $\phi$PRS, and $\phi$PSEL supplied thereto from the vertical scanning circuit 103, respectively.

The photodiode PD is an example of a photoelectric conversion unit. The photodiode PD produces and accumulates electric charges based on light incident to the pixel 100.

The amplification transistor MSF constitutes an amplification unit of the pixel 100. The amplification transistor MSF has a gate connected to a floating diffusion FD. The gate of the amplification transistor MSF and the floating diffusion FD constitute an input node of the amplification unit. The amplification transistor MSF has a source connected to the output line 102 with the selection transistor MSEL interposed therebetween.

The reset transistor MRS constitutes a reset unit. The reset transistor MRS is connected to the floating diffusion FD. When the control signal $\phi$PRS changes to the H level, the reset transistor MRS is set in the conducting state. Consequently, the floating diffusion FD is connected to a power supply VDD, and voltage of the floating diffusion FD is reset. That is, voltage of the input node of the amplification unit is reset. A state where the input node of the amplification unit is reset is referred to as a state where the pixel 100 is reset.

When the control signal $\phi$PTX changes to the H level, the transfer transistor MTX is set in the conducting state. Consequently, electric charges accumulated in the photodiode PD are transferred to the floating diffusion FD. When the control signal $\phi$PSEL changes to the H level, the selection transistor MSEL is set in the conducting state. Consequently, current is supplied to the amplification transistor MSF through the output line 102 from a current source (not illustrated). As a result, an analog signal (a pixel signal or a reset level signal) based on the voltage of the floating diffusion FD is read to the output line 102.

Figure 3:
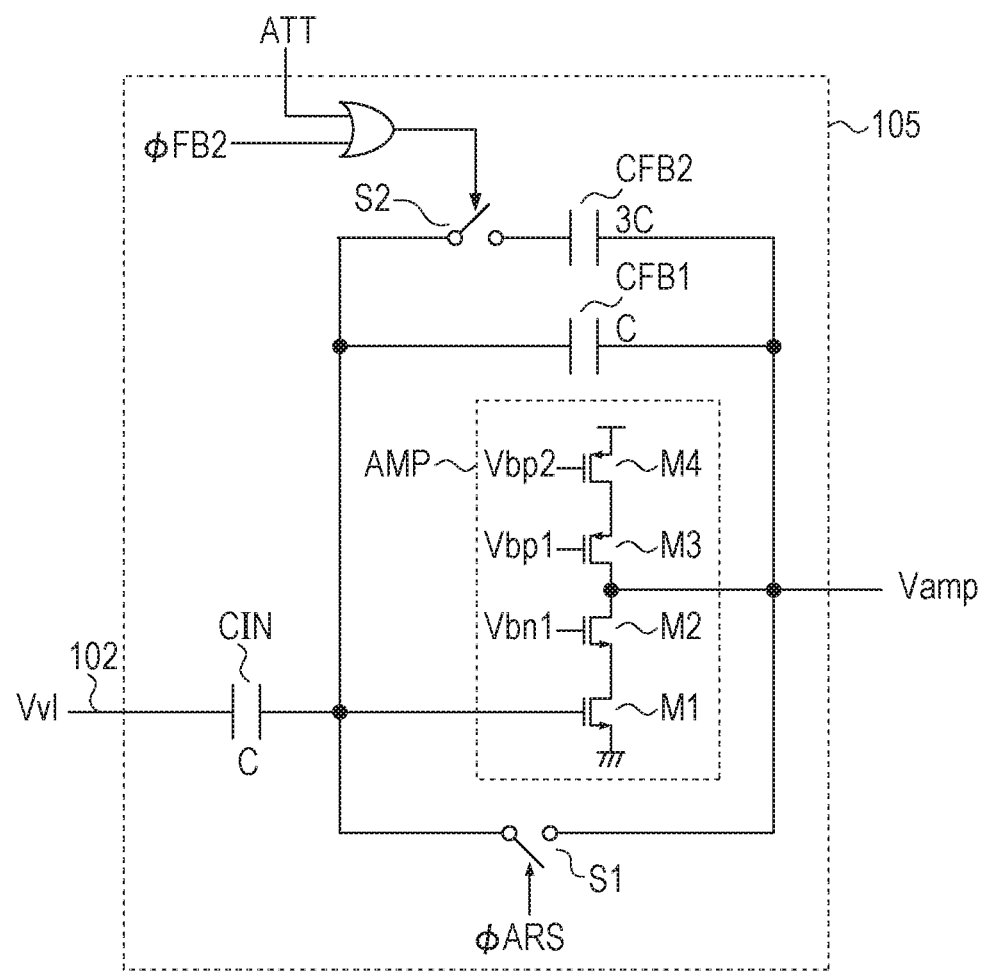
FIG. 3 is a diagram illustrating an equivalent circuit of an amplification circuit of the image pickup device.

FIG. 3 illustrates an example of a circuit configuration of the amplification circuit 105. The amplification circuit 105 includes an inverting amplifier AMP, a capacitor CIN, a capacitor CFB1, a capacitor CFB2, a switch S1, and a switch S2. The inverting amplifier AMP has an input terminal supplied with the output line signal Vvl through the capacitor CIN. The switch S1 and the capacitor CFB1 are connected in parallel to each other between the input terminal and an output terminal of the inverting amplifier AMP. In addition, the switch S2 and the capacitor CFB2 that are connected in series are connected in parallel to the switch S1 and the capacitor CFB1 between the input terminal and the output terminal of the inverting amplifier AMP.

The capacitors CFB1 and CFB2 function as feedback capacitors. On/off of the switch S2 is controlled in accordance with a logical sum of the determination signal ATT and a control signal $\phi$FB2. When the logical sum is at the H level, the switch S2 is in an ON state and the capacitor CFB2 functions as a feedback capacitor. As described later, the determination signal ATT is used for controlling the gain of the amplification circuit 105. The control signal φFB2 is used for resetting electric charges of the capacitor CFB2 independently from the gain control. When a control signal φARS has the H level, the switch S1 is in the ON state. As a result of the switch S1 being in the ON state, electric charges accumulated in the capacitors CFB1 and CFB2 are reset.

The amplification circuit 105 has a variable gain. The gain of the amplification circuit 105 is controlled to be a different value in accordance with switching of the switch S2 between ON and OFF. Capacitances of the capacitors CIN, CFB1, and CFB2 are appropriately set depending on the gain desired to be set in the amplification circuit 105. For example, capacitances of the capacitors CIN, CFB1, and CFB2 according to the first embodiment are set equal to C, C, and 3C, respectively. Thus, when the switch S2 is in an OFF state, the gain of the amplification circuit 105 is controlled to be equal to 1. When the switch S2 is in the ON state, the gain of the amplification circuit 105 is controlled to be equal to ¼. The inverting amplifier AMP outputs, as the amplified signal Vamp, a signal obtained by amplifying the output line signal Vvl at the set gain. As described above, the gain may be less than 1 or may be greater than 1. In addition, the gain of the amplification circuit 105 can be switched between three or more values by further adding one or more combinations of a switch and a capacitor that are connected in series.

For example, the inverting amplifier AMP according to the first embodiment is implemented by an n-channel metal-oxide semiconductor (NMOS) common-source amplifier circuit including transistors M1 and M2, which are NMOS transistors, and transistors M3 and M4, which are p-channel MOS (PMOS) transistors. The transistor M1 operates as a common-source amplification transistor. The transistor M2 operates as a common-gate amplification transistor. In addition, the transistors M3 and M4 are cascade-connected to constitute a constant current load. Gates of the transistors M2, M3, and M4 are supplied with DC bias voltages Vbn1, Vbp1, and Vbp2, respectively. The operating points of the transistors M2, M3, and M4 are determined in accordance with these DC bias voltages.

Figure 4:
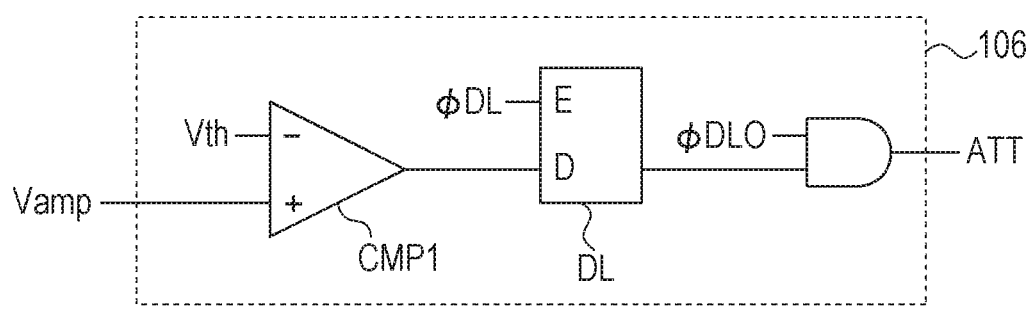
FIG. 4 is a diagram illustrating an equivalent circuit of a control circuit of the image pickup device.

FIG. 4 illustrates an equivalent circuit of the control circuit 106. The control circuit 106 includes a comparator CMP1, a D latch circuit DL, and an AND gate connected at a subsequent stage of the D latch circuit DL.

A non-inverting input terminal of the comparator CMP1 is supplied with the amplified signal Vamp, and an inverting input terminal of the comparator CMP1 is supplied with a signal representing the threshold Vth. The comparator CMP1 determines whether the signal value (level) of the amplified signal Vamp is greater or lower than the threshold Vth and supplies a signal based on the determination result to a D terminal of the D latch circuit DL. In other words, the comparator CMP1 compares the signal value of the amplified signal Vamp with the threshold Vth. The comparator CMP1 outputs an L-level signal when the signal value of the amplified signal Vamp is less than the threshold Vth and outputs an H-level signal when the signal value of the amplified signal Vamp is greater than the threshold Vth.

The D latch circuit DL stores the level of the signal supplied to the D terminal thereof and outputs the stored level, in accordance with a control signal φDL supplied to an E terminal thereof. The signal representing the comparison result is input to the D terminal from the comparator CMP1. Thus, the D latch circuit DL has a function of transferring the comparison result to a subsequent circuit at a timing at which the control signal φDL having the H level is input thereto.

One of input terminals of the AND gate is supplied with the signal output from the D latch circuit DL, and a control signal φDLO is input to the other input terminal of the AND gate. When the control signal φDLO has the H level, the D latch circuit DL outputs, as the determination signal ATT, the level stored therein to outside of the control circuit 106. That is, whether to output the level stored in the D latch circuit DL to the outside is selectable using the control signal φDLO.

In the first embodiment, an analog signal (a pixel signal or a reset signal) output from the pixel 100 is input to the amplification circuit 105 as the output line signal Vvl. The amplification circuit 105 outputs, as the amplified signal Vamp, the analog signal output from the pixel 100. The amplified signal Vamp is an analog signal. Then, the control circuit 106 outputs the determination signal ATT for controlling the gain of the amplification circuit 105 in accordance with the result of comparison between the signal value of the amplified signal Vamp and the threshold Vth. With such a configuration, each of the control circuits 106 according to the first embodiment controls the gain of the corresponding column signal processing unit 104 in accordance with comparison of the signal value of the analog signal output from the amplification unit of each pixel 100 with the threshold.

An operation of the image pickup device IM1 will be described next with reference to FIGS. 5 and 6. The operation of the image pickup device IM1 is performed as a result of the overall control unit 113 controlling the operations of the components of the image pickup device IM1. An operation of each of the pixels 100 is performed as a result of the overall control unit 113 controlling the vertical scanning circuit 103. In addition, reading of digital signals from the memory units 110 to the output unit 112 is performed as a result of the overall control unit 113 controlling the horizontal scanning circuit 111.

A read operation of reading a reset level signal and a pixel signal will be described with reference to a timing chart of FIG. 5. The timing chart of FIG. 5 illustrates the case where the signal value of the amplified signal Vamp obtained by amplifying the pixel signal at a gain of 1 is greater than the threshold Vth. A pixel signal read operation refers to an operation in which a pixel signal is read from the pixel 100 and a digital signal converted from the pixel signal is stored in the memory unit 110.

Figure 5:
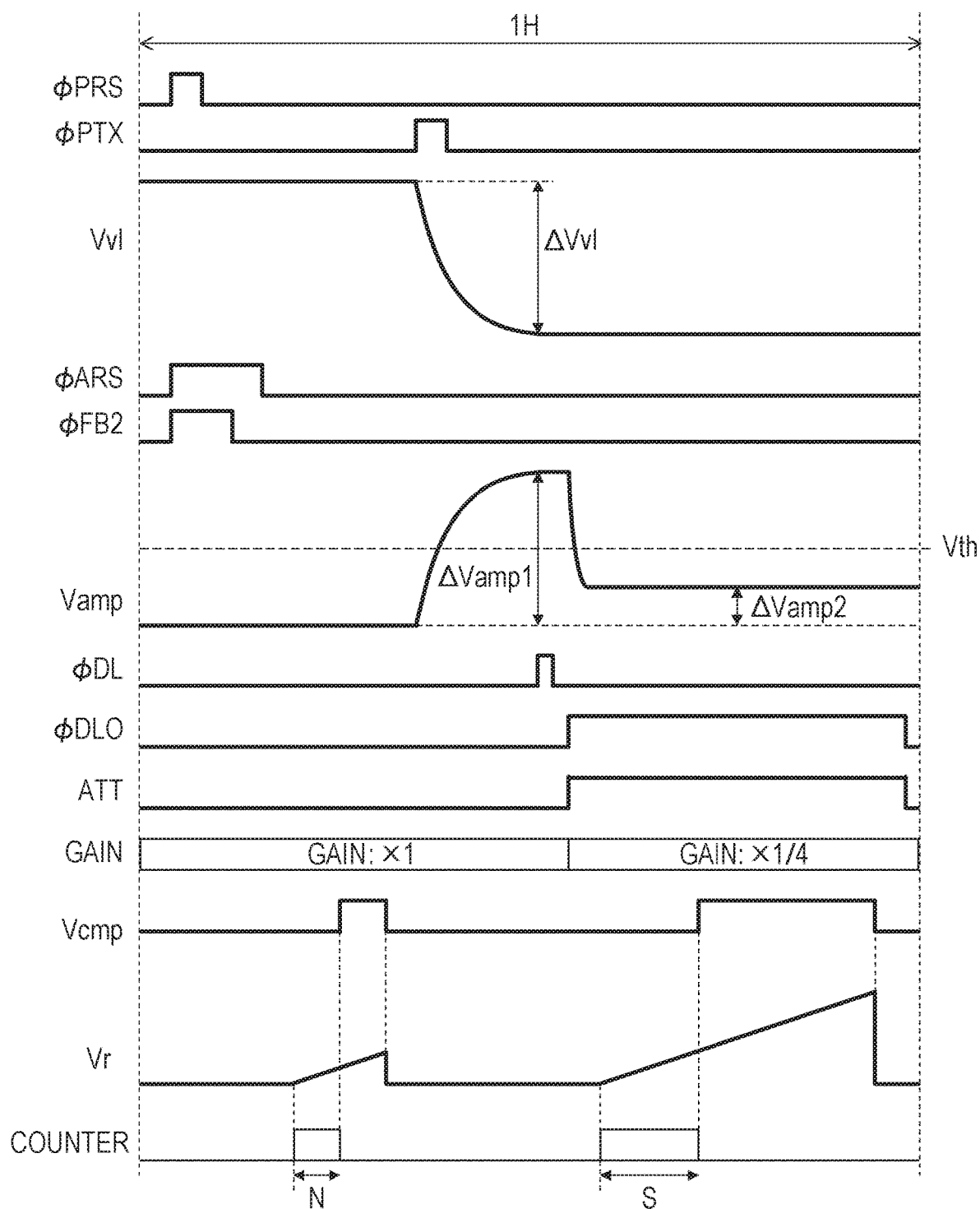
FIG. 5 is a timing chart schematically illustrating an operation of the image pickup device.

FIG. 5 illustrates an operation for reading a pixel signal from one of the pixels 100 once. The operation illustrated in FIG. 5 is simultaneously performed on the plurality of pixels 100 constituting the same row. FIG. 5 schematically illustrates a timing chart of a "1 H" period corresponding to reading of a single row. The image pickup device IM1 sequentially performs the operation illustrated in FIG. 5 on the plurality of rows of the pixel array 101 to read pixel signals from all the pixels 100 of the pixel array 101.

Over the period illustrated in FIG. 5, the vertical scanning circuit 103 maintains the control signal φPSEL supplied to each pixel 100 subjected to the pixel signal read operation at the H level and maintains the control signal φPSEL supplied to the other pixels 100 at the L level. In accordance with the control signal φPSEL of the H level, the amplification unit of the pixel 100 outputs an analog signal (a pixel signal or a reset signal) to the output line 102.

Upon the start of the pixel signal read operation, the vertical scanning circuit 103 temporarily changes the control signal φPRS to the H level to reset the pixel 100. Consequently, a signal based on the reset state of the pixel 100, that is, a reset level signal, is read to the output line 102. Once the reset level signal is read to the output line 102, the output line signal Vvl has a signal value based on the reset level signal. The overall control unit 113 temporarily changes the control signals φARS and φFB2 to the H level in parallel to resetting of the pixel 100 so as to reset electric charges accumulated in the capacitors CFB1, CFB2, and CIN. After the vertical scanning circuit 103 changes the control signal φPRS to the L level, the overall control unit 113 changes the control signals φARS and φFB2 to the L level.

Since the control signal φDLO has the L level at that time, the determination signal ATT output by the control circuit 106 has the L level. Since both the determination signal ATT and the control signal φFB2 have the L level, the switch S2 of the amplification circuit 105 is in the OFF state and the capacitor CFB2 does not serve as a feedback capacitor of the inverting amplifier AMP. Thus, the capacitance of the feedback capacitor of the inverting amplifier AMP is equal to C. Since the capacitance of an input capacitor (the capacitor CIN) connected between the input node of the inverting amplifier AMP and the output line 102 is also equal to C, the gain of the amplification circuit 105 is controlled to be equal to 1. Herein, controlling the gain of the amplification circuit 105 to be equal to 1 when reading a reset level signal is also referred to as controlling the gain applied to a reset level signal to be equal to 1. The same applies to the other signals. The same also applies to the case where the circuit in which the gain is set is other than the amplification circuit 105. For example, the gain of the amplification unit of the pixel 100 may be changed.

Thereafter, the reference signal generation circuit 107 starts supplying a ramp signal serving as the reference signal Vr in accordance with an instruction given thereto from the overall control unit 113. In other words, the reference signal generation circuit 107 starts changing the signal value of the reference signal Vr at a certain amount of change with respect to time. Simultaneously with this operation, the counter 109 starts counting up the count value to be output from zero in accordance with an instruction given thereto from the overall control unit 113. At a timing at which the comparison signal Vcmp changes from the L level to the H level as a result of the signal value of the reference signal Vr becoming greater than the signal value of the amplified signal Vamp, the memory 110N stores the count value output from the counter 109 at that timing. This count value corresponds to a digital signal obtained by performing AD conversion on the amplified signal Vamp, which is obtained by amplifying the reset level signal at a gain of 1. Hereinafter, a digital signal converted from a reset level signal is referred to as a digital signal N.

Then, the vertical scanning circuit 103 temporarily changes the control signal φPTX to the H level, and consequently the transfer transistor MTX turns on. Up until this point, electric charges produced in a predetermined exposure period are accumulated in the photodiode PD. Thus, the electric charges accumulated in the photodiode PD are transferred to the floating diffusion FD. As a result, a pixel signal is read from the pixel 100 to the output line 102, and the output line signal ΔVvl has a signal value based on the pixel signal. Let ΔVvl denote an amount of change in the signal value of the output line signal Vvl after the electric charges are transferred, with respect to the signal value of the output line signal Vvl when the pixel 100 is in the reset state. The amount of change ΔVvl is a value based on an amount of light incident to the pixel 100. In response to the change in the signal value of the output line signal Vvl, the signal value of the amplified signal Vamp also changes. Let ΔVamp1 denote an amount of change in the signal value of the amplified signal Vamp when the gain of the amplification circuit 105 is set to equal to 1.

The image pickup device IM1 changes the following operation between the case where the signal value of the amplified signal Vamp is greater than the threshold Vth and the case where the signal value of the amplified signal Vamp is less than the threshold Vth. In FIG. 5, the case is described where the signal value of the amplified signal Vamp obtained by amplifying the pixel signal at a gain of 1 is greater than the threshold Vth. Note that the threshold Vth is set to be less than or equal to ¼ of the output dynamic range of the amplification circuit 105. However, the threshold Vth may be set to any value within the output dynamic range of the amplification circuit 105.

After a predetermined period passes from the vertical scanning circuit 103 changing the control signal φPTX to the L level, the overall control unit 113 temporarily changes the control signal φDL to the H level. In the example illustrated in FIG. 5, since the signal value of the amplified signal Vamp is greater than the threshold Vth, the D latch circuit DL stores the H level. Then, the control signal φDLO is set to the H level, in response to which the control circuit 106 outputs the signal stored in the D latch circuit DL. That is, the determination signal ATT output from the control circuit 106 has the H level. As a result, the switch S2 of the amplification circuit 105 is set in the ON state, and the capacitor CFB2 serves as the feedback capacitor of the inverting amplifier AMP. The capacitance of the feedback capacitor connected to the inverting amplifier AMP becomes equal to 4C. Since the capacitance of the input capacitor CIN connected to the inverting amplifier AMP is equal to C, the gain of the amplification circuit 105 is controlled to be equal to ¼. In response to this control, the value of the amplified signal Vamp also changes. Let ΔVamp2 denote an amount of change in the signal value of the amplified signal Vamp when the gain of the amplification circuit 105 is set equal to ¼.

Then, the image pickup device IM1 converts the amplified signal Vamp obtained by amplifying the pixel signal into a digital signal in the same manner as the manner of AD conversion on the reset level signal. The memory 110S stores the digital signal converted from the pixel signal. Hereinafter, a digital signal converted from a pixel signal is referred to as a digital signal S. Thereafter, the memory 110D stores the level of the determination signal ATT. Lastly, the control signal φDLO is set to the L level, and the determination signal ATT is set to the L level in order to start reading for the next row.

As a result of the operation described above, the level of the determination signal ATT representing the result of comparison between the signal value of the pixel signal and the threshold Vth is stored in the memory 110D. In addition, the digital signal N converted from the reset level signal is stored in the memory 110N, and the digital signal S converted from the pixel signal is stored in the memory 110S. If the gain of the amplification circuit 105 is changed from 1 to ¼ as in the above example, the determination signal ATT having the H level is stored in the memory 110D. Then, the digital signal S representing the pixel signal amplified at a gain of ¼ is stored in the memory 110S.

Figure 6:
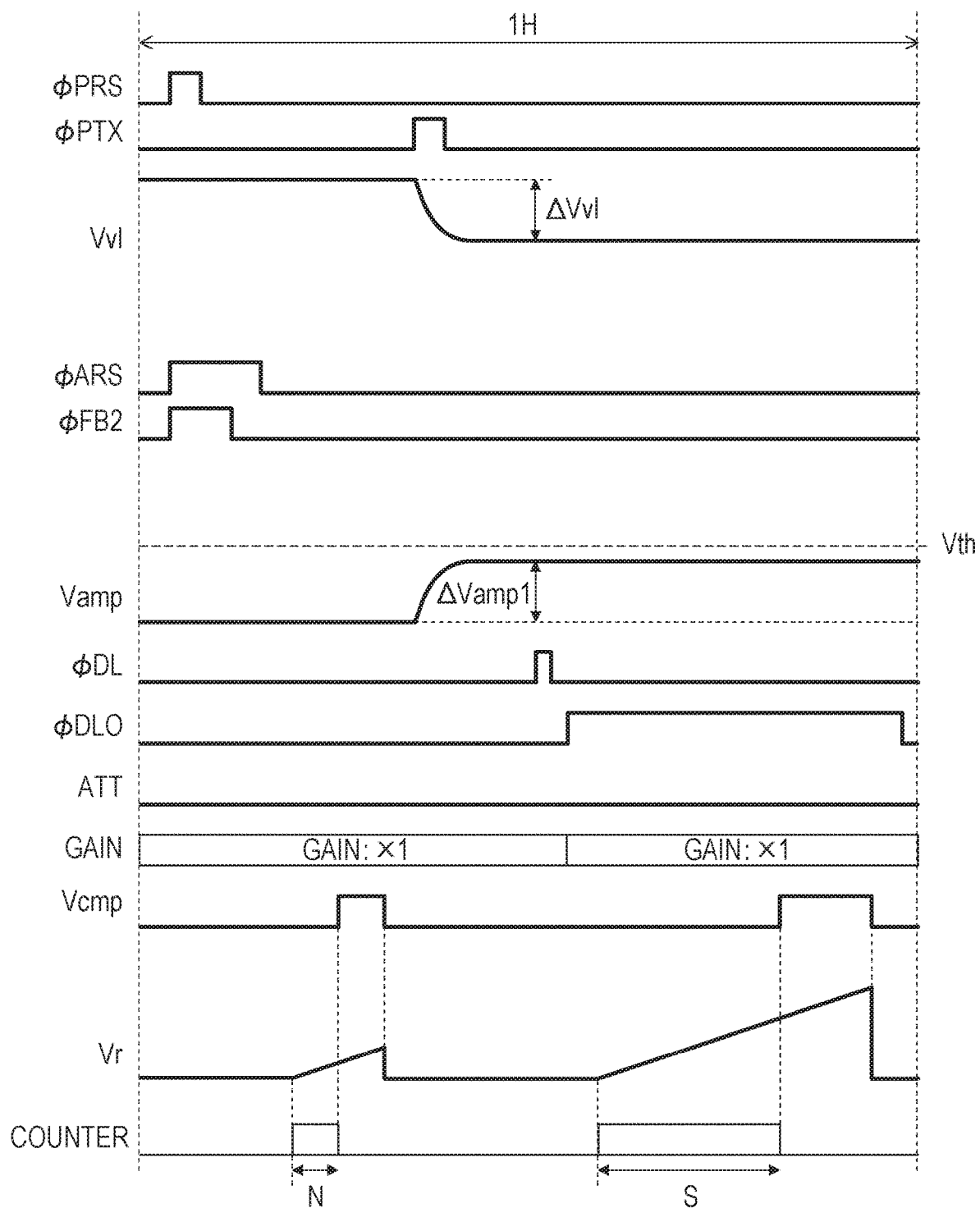
FIG. 6 is a timing chart schematically illustrating an operation of the image pickup device.

The timing chart of FIG. 6 illustrates the case where the signal value of the amplified signal Vamp obtained by amplifying the pixel signal at a gain of 1 is less than the threshold Vth. Part of FIG. 6 for which the description is omitted is the same as that of FIG. 5.

In FIG. 6, the amount of change ΔVvl and the amount of change ΔVamp1 are smaller than those of FIG. 5. In addition, the signal value of the amplified signal Vamp corresponding to the pixel signal is less than the threshold Vth. Thus, when the control signal ϕDLO has the H level, the determination signal ATT output from the control circuit 106 has the L level. As a result, the gain of the amplification circuit 105 is maintained at 1 when AD conversion is performed on the pixel signal. In this case, the determination signal ATT having the L level is stored in the memory 110D, and the digital signal S representing the pixel signal amplified at the gain of 1 is stored in the memory 110S.

The digital signal N representing the reset level signal amplified at the gain of 1 is stored in the memory 110N in both cases where the gain of the amplification circuit 105 is changed from 1 to ¼ and where the gain of the amplification circuit 105 is maintained at 1.

In both of FIGS. 5 and 6, after the operation of storing the digital signals in the memory unit 110, the digital signal N, the determination signal ATT, and the digital signal S stored in the memory unit 110 are read to the output unit 112 as a result of scanning performed by the horizontal scanning circuit 111. Then, the output unit 112 performs processing such as subtraction processing and gain error correction and outputs a digital signal D based on the electric charges accumulated in each photodiode PD. Note that processing such as gain error correction may be performed by an external signal processing device.

In FIGS. 5 and 6, the gain of the amplification circuit 105 is initially controlled to be equal to a relatively high gain (second gain). Then, the gain of the amplification circuit 105 is controlled to be equal to a relatively low gain (first gain). However, this order may be reversed. That is, the gain may be initially controlled to be equal to the relatively low gain (first gain) and then, if the signal value of the pixel signal is less than the threshold Vth, to the relatively high gain (second gain).

Figure 7:
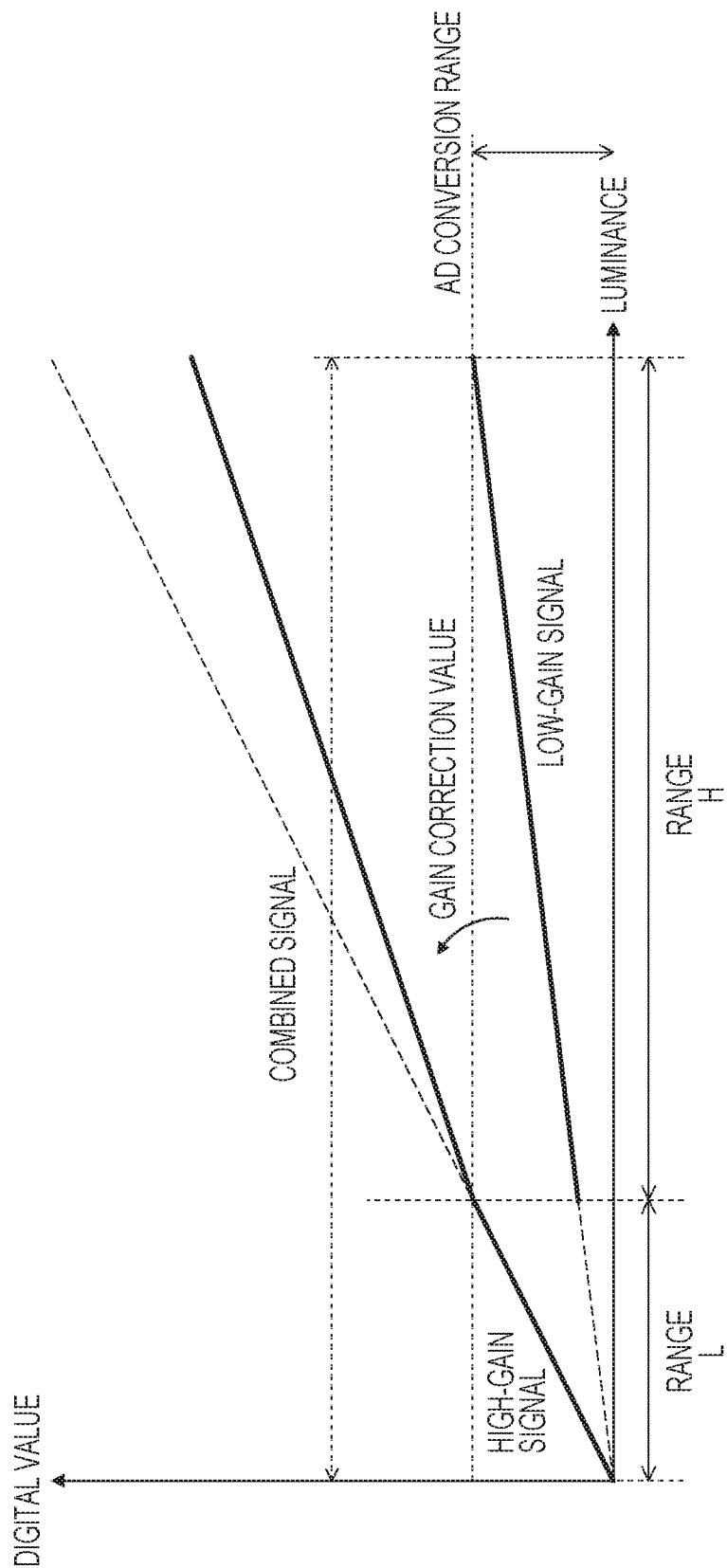
FIG. 7 is a diagram schematically illustrating a relationship between a signal value of a signal output from the image pickup device and luminance.

FIG. 7 is a diagram schematically illustrating a relationship between luminance and a signal value of the digital signal D. The horizontal axis represents luminance, and the vertical axis represents the signal value of the digital signal D. In a low-luminance range L, the gain of the amplification circuit 105 is controlled to be equal to the relatively high gain (second gain). In the first embodiment, the relatively high gain is equal to 1. A signal obtained when the gain of the amplification circuit 105 is controlled to be equal to the relatively high gain is referred to as a high-gain signal for convenience. In a high-luminance range H, the gain of the amplification circuit 105 is controlled to be equal to the relatively low gain (first gain). In the first embodiment, the relatively low gain is equal to ¼. A signal obtained when the gain of the amplification circuit 105 is controlled to be equal to the relatively low gain is referred to as a low-gain signal for convenience.

To maintain the linearity of the low-gain signal and the high-gain signal, the low-gain signal is usually corrected in accordance with a gain ratio. In the first embodiment, since the gain ratio (the relatively high gain/the relatively low gain) is equal to 4, the signal value of the low-gain signal is multiplied by 4. Each of the low-gain signal and the high-gain signal takes a signal value that is within the dynamic range of the AD conversion unit (AD conversion range). In contrast, by performing correction based on the gain ratio, the digital signal D whose signal value changes beyond the AD conversion range in accordance with a change in luminance over a wide range from the low-luminance range L to the high-luminance range H is successfully obtained. That is, as a result of each of the column signal processing units 104 processing an analog signal (a pixel signal or a reset level signal) output from each of the pixels 100 by using a variable gain, the dynamic range is successfully increased.

There are cases where the actual gain ratio does not match the set value due to the influence of circuit design errors or the like. Thus, the high-gain signal and a signal obtained by correcting the low-gain signal in accordance with the gain ratio sometimes do not become linear as illustrated in FIG. 7. In such a case, the linearity is successfully improved by adjusting a gain-ratio-based correction value. FIG. 7 further illustrates a combined signal obtained by adjusting the correction value.

In the first embodiment, the dynamic range can be further increased by combining a plurality of pieces of image data obtained in different exposure periods. The image pickup device IM1 according to the first embodiment resets the photoelectric conversion units before reading pixel signals. In general, an exposure period refers to a period from when the photoelectric conversion unit is reset to when transfer of electric charges is finished in FIG. 5. The transfer of the electric charges ends upon the control signal ϕPTX changing from the H level to the L level.

In some modifications, electric charges produced in a plurality of discrete periods are added together in a charge storage unit of the pixel 100. In such cases, the sum of the plurality of discrete periods serves as a single exposure period. Since the electric charges are added together in the charge storage unit, the electric charges produced in the plurality of discrete periods are output as a single pixel signal. Thus, the sum of the plurality of discrete periods corresponds to a single exposure period. The charge storage unit is, for example, the floating diffusion FD or a storage capacitor provided separately from the floating diffusion FD.

Figure 8:
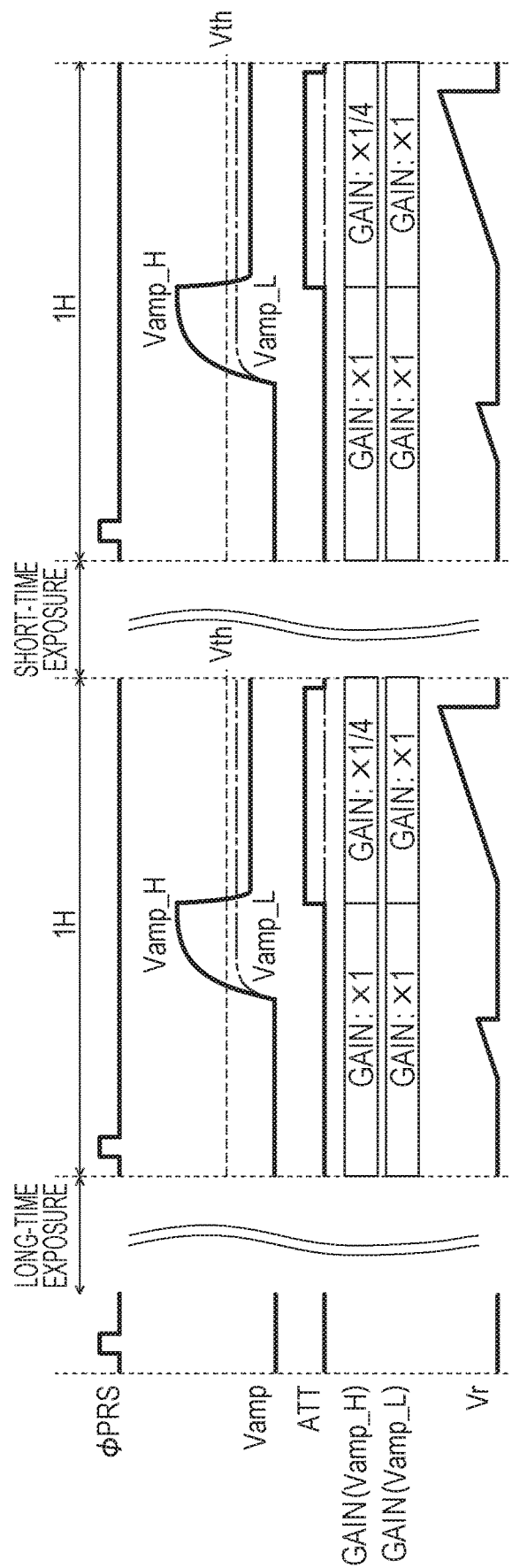
FIG. 8 is a timing chart schematically illustrating an operation of the image pickup device.

An operation for obtaining a plurality of pieces of image data in different exposure periods will be described with reference to a timing chart of FIG. 8. FIG. 8 illustrates some of the signals illustrated in FIGS. 5 and 6. The same elements as those illustrated in FIGS. 5 and 6 are denoted by the same reference signs to omit a detailed description thereof.

First, a long-time exposure (first exposure period) is performed. After the first exposure period, the digital signal D based on electric charges produced in the first exposure period is read in a "1 H" period corresponding to reading of one row. The read operation of the "1 H" period is the operation described in FIG. 5 or 6. Then, a short-time exposure (second exposure period) is performed. After the second exposure period, the digital signal D based on electric charges produced in the second exposure period is read in a "1 H" period corresponding to reading of one row.

Note that the expressions "long-time" and "short-time" indicate a relative relationship in the duration of the exposure period. That is, the terms "long-time exposure (first exposure period)" and "short-time exposure (second exposure period)" indicate that one of the exposure periods (first exposure period) is longer than the other exposure period (second exposure period). In addition, in the case of capturing a moving image, the long-time exposure and the short-time exposure are performed alternately. In general, in the case of controlling the duration of the exposure period in accordance with brightness of a subject, the duration of the exposure period changes in a stepped manner. In terms of this point, control of the exposure period to increase the dynamic range is different from control of the exposure period in accordance with brightness of the subject.

In FIG. 8, an amplified signal Vamp_H represents the case where the signal value of the amplified signal Vamp obtained by amplifying the pixel signal at the gain of 1 is greater than the threshold Vth. In addition, an amplified signal Vamp_L represents the case where the signal value of the amplified signal Vamp obtained by amplifying the pixel signal at the gain of 1 is less than the threshold Vth. Also in FIG. 8, the gain of the amplification circuit 105 for these cases is illustrated as a gain (Vamp_H) and a gain (Vamp_L). In each of the "1 H" period subsequent to the long-time exposure (first exposure period) and the "1 H" period subsequent to the short-time exposure (second exposure period), the control circuit 106 controls the gain of the amplification circuit 105 in accordance with the result of comparison between the signal value of the amplified signal Vamp and the threshold Vth.

In a modification, the control circuit 106 may control the gain based on the signal value of the amplified signal Vamp for only one of the "1 H" period subsequent to the long-time exposure (first exposure period) and the "1 H" period subsequent to the short-time exposure (second exposure period). For example, only in the "1 H" period subsequent to the long-time exposure (first exposure period), the control circuit 106 compares the signal value of the amplified signal Vamp with the threshold Vth and controls the gain in accordance with a result of the comparison.

A first image constituted by the digital signals D based on electric charges produced in the first exposure period and a second image constituted by the digital signals D based on electric charges produced in the second exposure period are combined into an image by an external image combining device. Consequently, an image with a wider dynamic range is successfully obtained.

Figure 9:
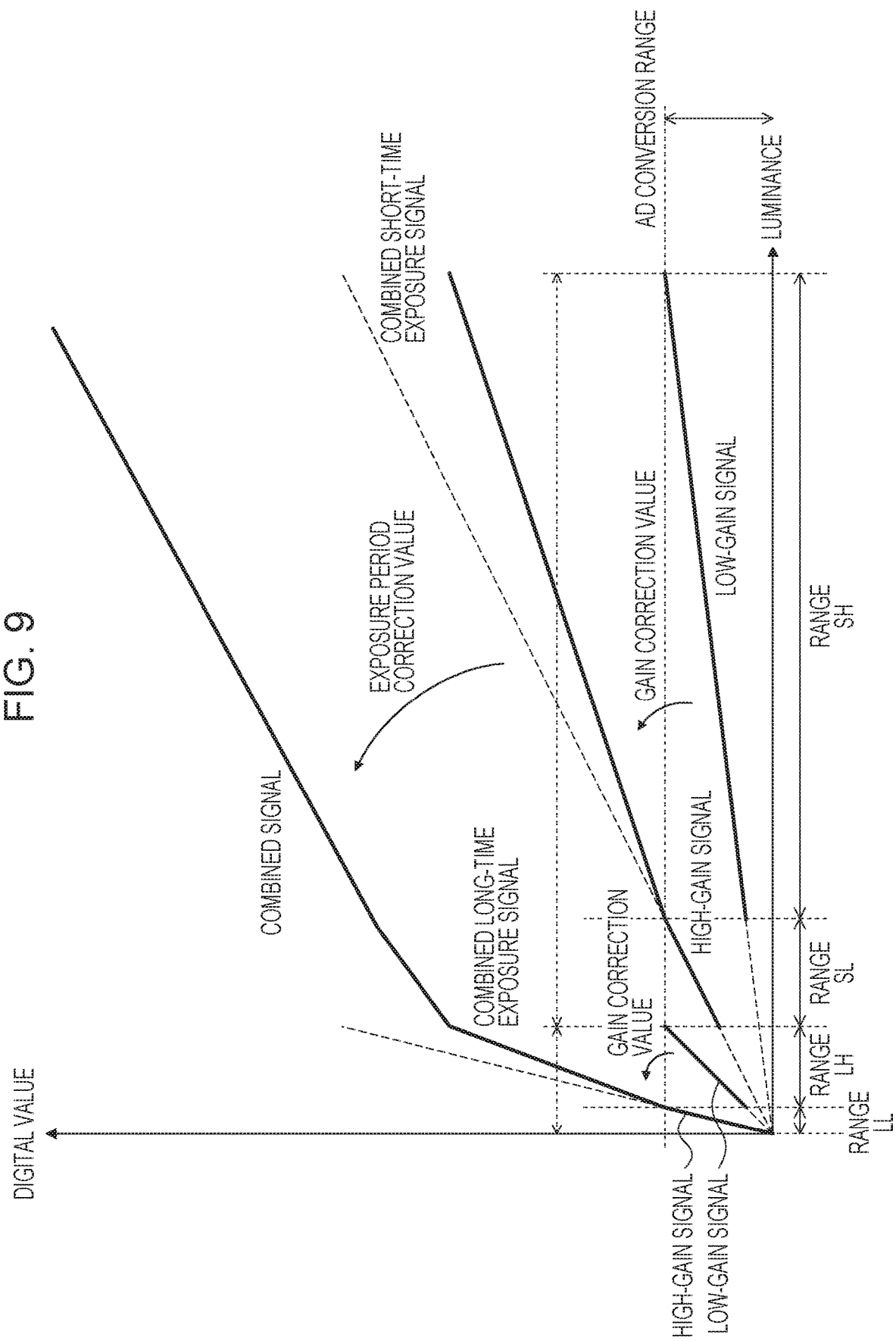
FIG. 9 is a diagram schematically illustrating a relationship between a signal value of a signal output from the image pickup device and luminance.

FIG. 9 is a diagram schematically illustrating a relationship between luminance and the signal value of the digital signal D. The horizontal axis represents luminance, and the vertical axis represents the signal value of the digital signal D. The relationship between the luminance and the signal value of the digital signal D is selected from four combinations in which the gain of the amplification circuit 105 and the duration of the exposure period are different in accordance with the luminance.

Luminance ranges are referred to as a range LL, a range LH, a range SL, and a range SH sequentially from the lower side. In the ranges LL and LH, the digital signals D obtained by the long-time exposure (first exposure period) are used. The digital signals D of this case are collectively referred to as long-time exposure signals. The long-time exposure signals include a high-gain signal and a low-gain signal as in the description given with reference to FIG. 7. That is, when the luminance is in the range LL located on the lower luminance side, the gain of the amplification circuit 105 is controlled to be equal to the relatively high gain (second gain). When the luminance is in the range LH located on the higher luminance side, the gain of the amplification circuit 105 is controlled to be equal to the relatively low gain (first gain). In addition, the low-gain signal is corrected based on the gain ratio as in the description given with reference to FIG. 7.

In the ranges SL and SH, the digital signals D obtained by the short-time exposure (second exposure period) are used. The digital signals D of this case are collectively referred to as short-time exposure signals. The short-time exposure signals include a high-gain signal and a low-gain signal as in the description given with reference to FIG. 7. That is, when the luminance is in the range SL located on the lower luminance side, the gain of the amplification circuit 105 is controlled to be equal to the relatively high gain (second gain). When the luminance is in the range SH located on the higher luminance side, the gain of the amplification circuit 105 is controlled to be equal to the relatively low gain (first gain). In addition, the low-gain signal is corrected based on the gain ratio as in the description given with reference to FIG. 7.

As described with reference to FIG. 7, for each of the long-time and short-time exposure signals, the digital signal D whose signal value changes beyond the AD conversion range is successfully obtained. By combining the long-time and short-time exposure signals together, a wider dynamic range can be implemented as illustrated in FIG. 9.

When combining the long-time and short-time exposure signals, a gain based on a ratio between the durations of the exposure periods is applied to the short-time exposure signal. FIG. 9 illustrates a signal obtained by applying the gain, which serves as an exposure period correction value, to the short-time exposure signal. Usually, a gain greater than that applied to the long-time exposure signal is applied to the short-time exposure signal.

As described above, in accordance with the first embodiment, the digital signal D based on electric charges produced by a long-time exposure (first exposure period) and the digital signal D based on electric charges produced by a short-time exposure (second exposure period) are read. When the digital signals D are read, the gain applied to a pixel signal output by each of the pixels 100 is controlled in accordance with comparison between the signal value of the pixel signal and the threshold Vth. With such a configuration, the dynamic range is successfully increased.

In the first embodiment described above, the description has been given of correction based on the gain ratio, combination of images obtained in exposure periods of different durations, and correction based on a ratio between the durations of the exposure periods used when the images are combined together. However, these processes are performed outside the image pickup device IM1. That is, these processes are not necessarily performed in embodiments of the present invention. The image pickup device according to the first embodiment reads signals based on electric charges produced in exposure periods of different durations and controls the gain based on comparison so as to output signals with an increased dynamic range. In some embodiments, the image pickup device IM1 includes an image processing unit that performs the correction and image combination processes described above.

Second Embodiment

A second embodiment will be described. In the first embodiment, the control circuit 106 controls the gain of the amplification circuit 105 in accordance with the signal value of the amplified signal Vamp in both of a "1 H" period subsequent to a long-time exposure and a "1 H" period subsequent to a short-time exposure. In contrast, in the second embodiment, the gain of the amplification circuit 105 is fixed when a pixel signal based on electric charges produced in the short-time exposure (second exposure period) is read. In other words, comparison of the signal value of the amplified signal Vamp with the threshold Vth and gain control based on the result of the comparison are performed only for the "1 H" period subsequent to the long-time exposure (first exposure period). Thus, part different from that of the first embodiment is mainly described below, and a description of part that is the same or substantially the same as that of the first embodiment is omitted.

An image pickup device IM1 according to the second embodiment has a configuration that is the same or substantially the same as the configuration of the first embodiment. That is, FIG. 1 schematically illustrates a configuration of the image pickup device IM1 according to the second embodiment. A description of FIG. 1 is omitted.

The pixels 100 and the amplification circuit 105 included in each of the column signal processing units 104 according to the second embodiment have configurations that are the same or substantially the same as those of the first embodiment. That is, FIGS. 2 and 3 respectively illustrate equivalent circuits of each of the pixels 100 and the amplification circuit 105 according to the second embodiment. A description of FIGS. 2 and 3 is omitted.

Operations of the individual components of the image pickup device IM1 according to the second embodiment are the same or substantially the same as those of the first embodiment. That is, the image pickup device IM1 operates based on the control signals illustrated in FIGS. 5 and 6. However, when reading a signal based on electric charges produced by a short-time exposure (second exposure period), the image pickup device IM1 according to the second embodiment operates differently from the first embodiment.

In the second embodiment, the dynamic range is successfully increased by combining a plurality of pieces of image data obtained in exposure periods of different durations as in the first embodiment. Since the definition of the exposure period has been described in the first embodiment, a duplicate description is omitted.

Figure 10:
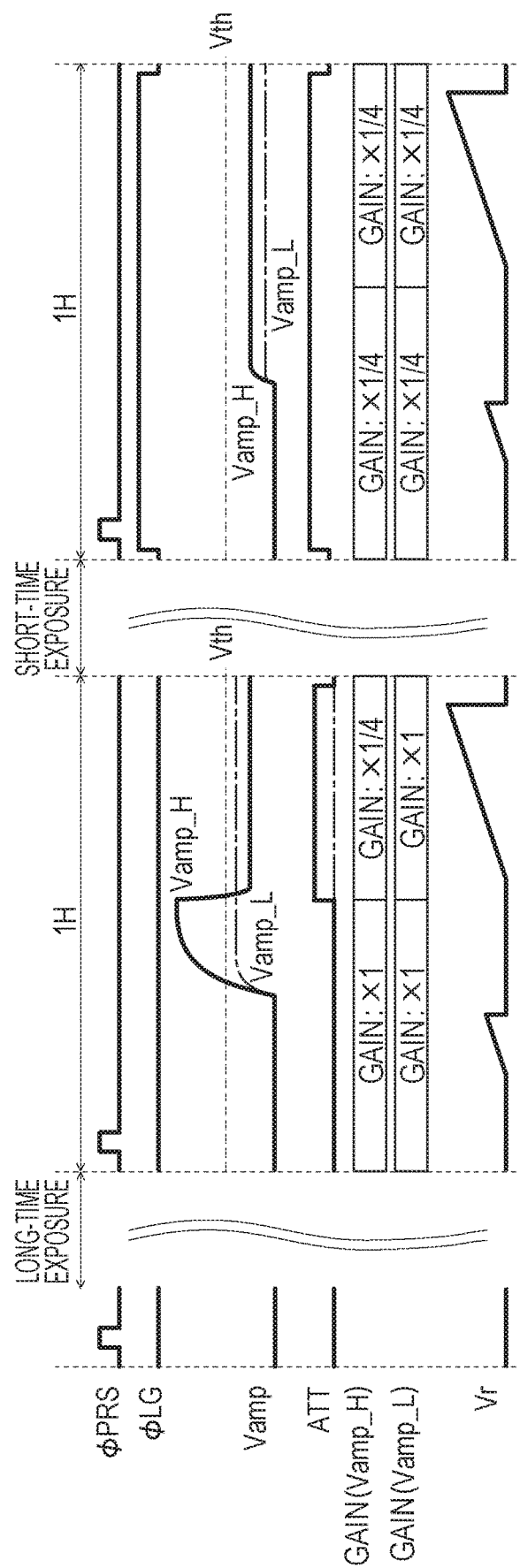
FIG. 10 is a timing chart schematically illustrating an operation of an image pickup device.

An operation for obtaining a plurality of pieces of image data in exposure periods of different durations will be described with reference to a timing chart of FIG. 10. FIG. 10 illustrates some of the control signals illustrated in FIGS. 5 and 6. Elements that are the same or substantially the same as those illustrated in FIG. 5, 6, or 8 are denoted by the same reference signs to omit a detailed description thereof. An operation of reading a signal obtained by a long-time exposure (first exposure period) is the same or substantially the same as that illustrated in FIG. 8.

In the second embodiment, when a digital signal D based on electric charges produced by a short-time exposure (second exposure period) is read, the gain of the amplification circuit 105 is fixed. In FIG. 10, the amplified signal Vamp_H indicates the case where the signal value of the amplified signal Vamp obtained by amplifying a pixel signal at a gain of 1 is greater than the threshold Vth, and the amplified signal Vamp_L indicates the case where the signal value of the amplified signal Vamp obtained by amplifying a pixel signal at the gain of 1 is less than the threshold Vth. Also in FIG. 10, the gain of the amplification circuit 105 for these cases is represented as a gain (Vamp_H) and a gain (Vamp_L). In either case, the gain of the amplification circuit 105 is controlled to be equal to the relatively low gain (first gain) as illustrated in FIG. 10. Comparison between the operation for the long-time exposure (first exposure period) and the operation for the short-time exposure (second exposure period) illustrated in FIG. 10 indicates that the relatively low gain is used for the short-time exposure even if the signal value is a value for which the relatively high gain is used for the long-time exposure.

Examples of a method for fixing the gain of the amplification circuit 105 at least include controlling the gain regardless of the result of comparison between the signal value of the amplified signal Vamp with the threshold Vth, controlling the gain of the amplification circuit 105 without performing the comparison, or changing the threshold Vth used in the comparison.

Figure 11:
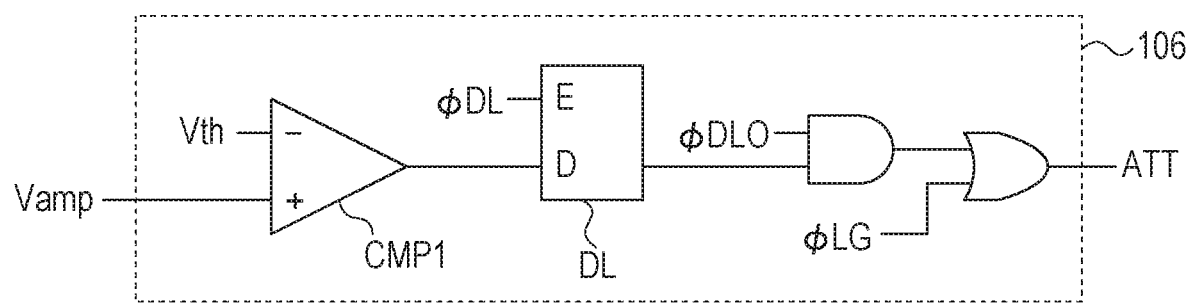
FIG. 11 is a diagram illustrating an equivalent circuit of a control circuit of the image pickup device.

In the second embodiment, a method for controlling the gain regardless of the result of comparison will be described. FIG. 11 illustrates an example of the control circuit 106 that controls the gain of the amplification circuit 105. The control circuit 106 according to the second embodiment differs from the control circuit 106 illustrated in FIG. 4 in that the control circuit 106 according to the second embodiment includes an OR gate at an output stage. The OR gate receives an output from the AND gate and a control signal ϕLG. When the control signal ϕLG has the H level, the determination signal ATT has the H level regardless of the output from the AND gate, that is, regardless of the result of comparison. As described above, the control signal ϕLG and the OR gate allow the determination signal ATT to have the H level regardless of the result of comparison, which consequently fixes the gain. In this example, the gain is fixed to ¼ (relatively low gain). By using an AND gate in place of the OR gate, the gain is successfully fixed to 1 (relatively high gain). As described above, by providing a logic gate at the output stage of the control circuit 106, the level of the determination signal ATT is successfully fixed.

As illustrated in FIG. 10, the control signal ϕLG has the L level in the "1 H" period subsequent to the long-time exposure (first exposure period). That is, the level of the determination signal ATT changes in accordance with the result of comparison between the signal value of the amplified signal Vamp and the threshold Vth. On the other hand, the control signal ϕLG has the H level in the "1 H" period subsequent to the short-time exposure (second exposure period). Thus, the gain of the amplification circuit 105 is fixed to ¼ (relatively low gain).

Note that the gain applied to the reset level signal in the "1 H" period subsequent to the long-time exposure (first exposure period) is equal to 1. The gain applied to the reset level signal in the "1 H" period subsequent to the short-time exposure (second exposure period) is equal to ¼.

Figure 12:
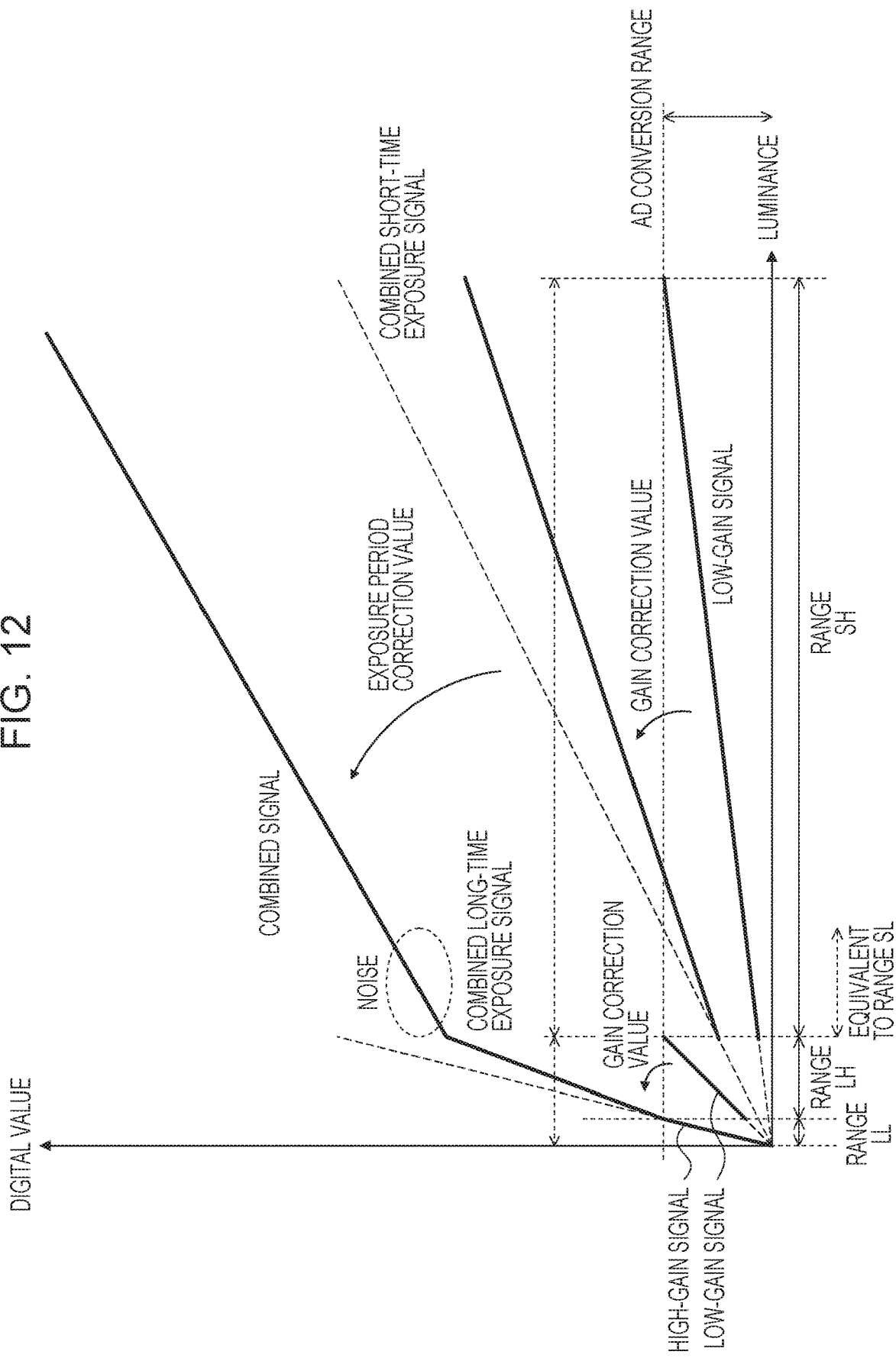
FIG. 12 is a diagram schematically illustrating a relationship between a signal value of a signal output from the image pickup device and luminance.

FIG. 12 is a diagram schematically illustrating a relationship between luminance and the signal value of the digital signal D. The horizontal axis represents luminance, and the vertical axis represents the signal value of the digital signal D. The relationship between the luminance and the signal value of the digital signal D is selected from three combinations in which the gain of the amplification circuit 105 and the duration of the exposure period are different in accordance with the luminance.

Luminance ranges are referred to as a range LL, a range LH, and a range SH sequentially from the lower side. In the ranges LL and LH, the digital signals D obtained by the long-time exposure (first exposure period) are used. The digital signals D of this case are collectively referred to as long-time exposure signals. The long-time exposure signals include a high-gain signal and a low-gain signal as in the description given with reference to FIG. 7. That is, when the luminance is in the range LL located on the lower luminance side, the gain of the amplification circuit 105 is controlled to be equal to the relatively high gain (second gain). When the luminance is in the range LH located on the higher luminance side, the gain of the amplification circuit 105 is controlled to be equal to the relatively low gain (first gain). In addition, the low-gain signal is corrected based on the gain ratio as in the description given with reference to FIG. 7.

In the range SH located on the higher luminance side of the range LH, the digital signal D obtained by the short-time exposure (second exposure period) is used. This digital signal D is referred to as a short-time exposure signal. For the short-time exposure, the gain of the amplification circuit 105 is fixed to the relatively low gain (first gain). Thus, only the low-gain signal is read as a short-time exposure signal. As in the first embodiment, correction based on the gain ratio and correction based on the ratio between the durations of the exposure periods are performed on the short-time exposure signal.

As illustrated in FIG. 12, a high-gain signal is not used as a short-time exposure signal in the second embodiment. In other words, a range equivalent to the range SL illustrated in FIG. 9 is not present. Thus, when the luminance is on the lower luminance side in the range SH, the signal value of the pixel signal is small and the gain of the amplification circuit 105 is also small. Thus, a ratio of the signal value to noise of the circuit (signal-to-noise ratio, SN ratio) becomes relatively small in some cases. Since the gain for the exposure period correction is applied to the digital signal having a small SN ratio, the influence of the noise of the circuit relatively increases.

However, by appropriately setting a ratio between the duration of the long-time exposure (first exposure period) and the duration of the short-time exposure (second exposure period) and a ratio between the gains of the amplification circuit 105, part where noise is likely to occur is successfully removed from the range SH.

This will be described with reference to FIG. 9. In FIG. 9, a high-gain signal and a low-gain signal are used as the long-time exposure signals and the short-time exposure signals as described above. How the ranges LL, LH, SL, and SH change in response to changes in the ratio between the durations of the exposure periods and the gain ratio will be described.

If the first exposure period (long-time exposure) increases, the sum of the ranges LL and LH decreases. If the first exposure period (long-time exposure) decreases, the sum of the ranges LL and LH increases. Since a long-time exposure signal is used for a low luminance portion of a subject, the sum of the ranges LL and LH changes with respect to a point of a luminance of 0.

The same applies to the second exposure period (short-time exposure). If the second exposure period (short-time exposure) increases, the sum of the ranges SL and SH decreases. If the second exposure period (short-time exposure) decreases, the sum of the ranges SL and SH increases. The short-time exposure signal has a signal value equivalent to that for a lower luminance (in the ranges LL and LH). This is represented by a thin (dashed) line in FIG. 9. Accordingly, the sum of the ranges SL and SH changes with respect to the point of the luminance of 0.

Figure 13:
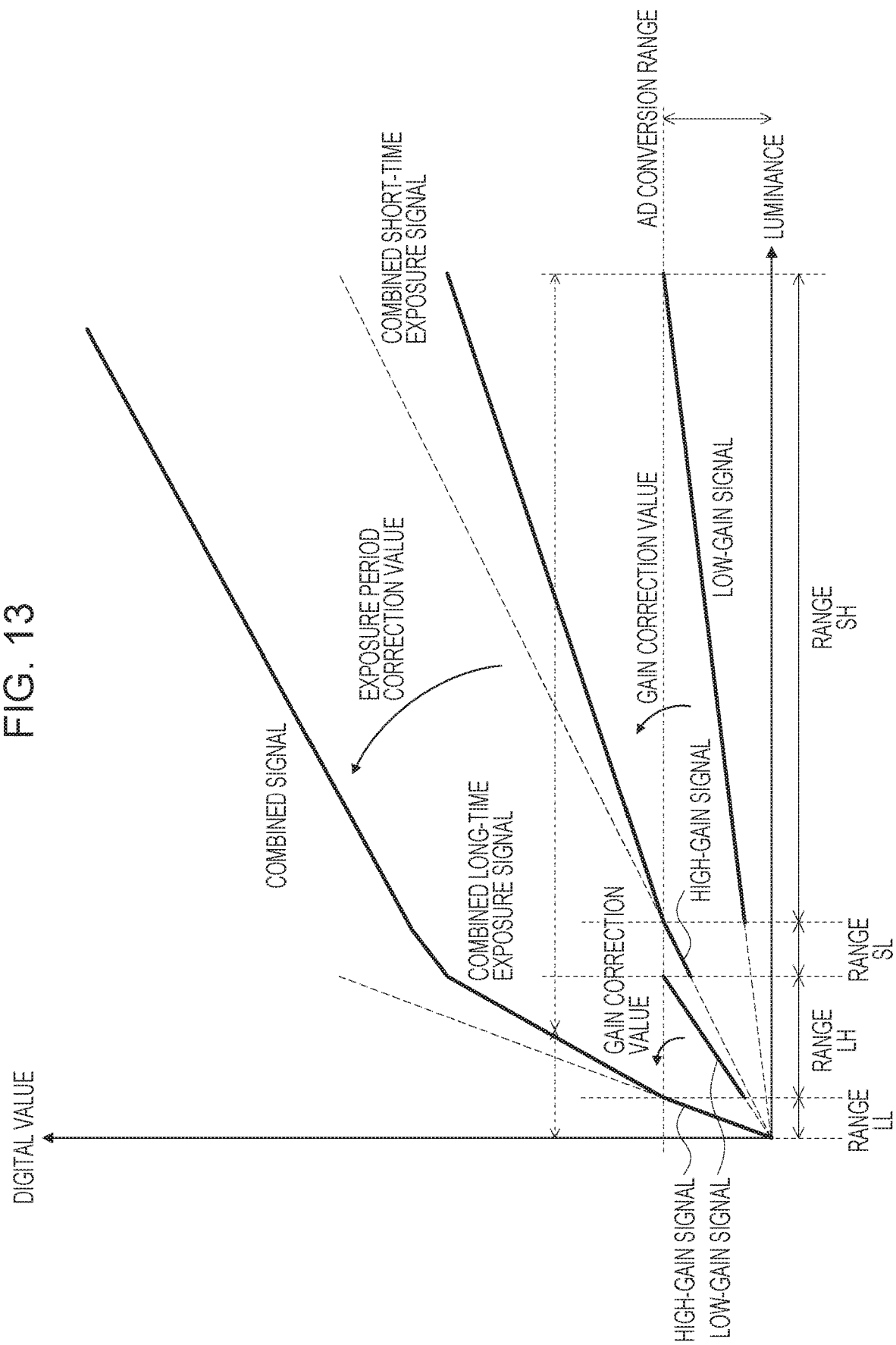
FIG. 13 is a diagram schematically illustrating a relationship between a signal value of a signal output from the image pickup device and luminance.

FIG. 13 illustrates a specific example in which the first exposure period (long-time exposure) is shorter than that of the case illustrated in FIG. 9. FIG. 13 is a diagram schematically illustrating a relationship between luminance and the signal value of the digital signal D just like FIG. 9.

When FIG. 13 is compared with FIG. 9, the sum of the ranges LL and LH has increased. However, the conditions remain unchanged for the short-time exposure (second exposure period). As a result, the range SL has decreased. More accurately, on the higher luminance side in the range LH (part close to the range SL), either the low-gain signal of the long-time exposure or the high-gain signal of the short-time exposure may be used. If the first exposure period (long-time exposure) is further decreased in this way, the sum of the range LL and the range LH increases to cover the entire range SL illustrated in FIG. 9. As a result, the high-gain signal of the short-time exposure no longer needs to be used. The low-gain signal of the long-time exposure used in place of the high-gain signal of the short-time exposure has a relatively large signal value. Thus, the SN ratio is also relatively high. As a result, noise is successfully reduced.

Figure 14:
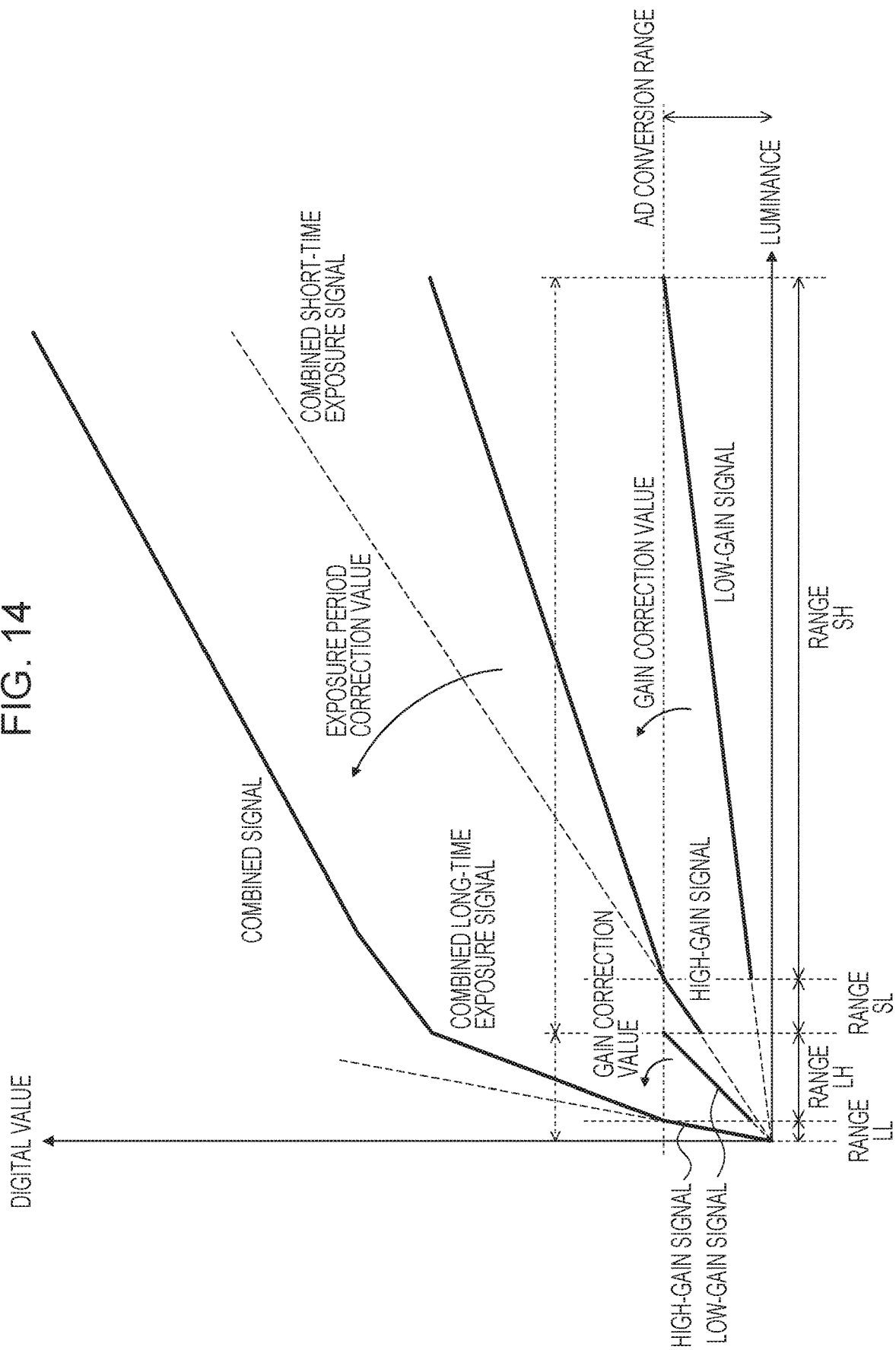
FIG. 14 is a diagram schematically illustrating a relationship between a signal value of a signal output from the image pickup device and luminance.

If the gain of the amplification circuit 105 increases, the widths of the ranges decrease. On the other hand, if the gain decreases, the widths of the ranges increase. FIG. 14 illustrates a specific example in which the relatively high gain (second gain) is greater than that of FIG. 9. FIG. 14 is a diagram schematically illustrating a relationship between luminance and the signal value of the digital signal D just like FIG. 9. The relatively low gain (first gain) is equal to that of FIG. 9.

As illustrated in FIG. 14, the ranges LL and SL have decreased, whereas the ranges LH and SH have increased because the high-gain signal reaches the saturation level at a lower luminance due to an increased gain.

By changing the gain ratio in this way, the ranges LL, LH, SL, and SH are successfully changed. For example, by decreasing the relatively low gain used in the long-time exposure (first exposure period) and increasing the relatively high gain used in the short-time exposure (second exposure period), the range (the range SL) in which the high-gain signal of the short-time exposure is used is successfully decreased.

A description will be given next of advantageous effects of fixing the gain of the amplification circuit 105 when a pixel signal based on electric charges produced in the second exposure period (short-time exposure) is processed. By fixing the gain, noise due to an offset between different gains is successfully reduced.

In the case where the gain applied to a pixel signal is selectively controlled to be equal to one of a plurality of gains in accordance with comparison of the signal value of the amplified signal Vamp with the threshold Vth, the gain applied to the reset level signal and the gain applied to the pixel signal differ in some cases. When different gains are set in the amplification circuit 105, the output amplified signals Vamp may have different offsets due to feedthrough of the switches, for example. That is, a difference in the offset may occur in addition to a difference in the gain between the amplified signal Vamp of the reset level signal and the amplified signal Vamp of the pixel signal.

In the case where correlated double sampling (CDS) is performed, subtraction processing is performed for the pixel signal and the reset level signal. When different gains are applied to the pixel signal and the reset level signal, the signal value is amplified in accordance with the gain ratio before the subtraction processing is performed. However, since the difference in the offset described above is amplified at that time, noise may be caused consequently.

Since the column signal processing units 104 often have different offsets, it is difficult to reduce noise resulting from the difference in the offset by performing correction. In particular, the gain is applied to the short-time exposure signal in accordance with the ratio between the durations of the exposure periods when the images are combined together. Thus, the noise becomes further conspicuous.

In contrast, by fixing the gain of the amplification circuit 105 when the pixel signal based on electric charges produced in the second exposure period (short-time exposure) is processed, the gain applied to the pixel signal and the gain applied to the reset level signal are controlled to be substantially equal, which can consequently reduce a difference in the offset between the pixel signal and the reset level signal. Thus, the offset components contained in the amplified signals Vamp are successfully cancelled out by the subtraction processing. As a result, noise is successfully reduced.

Another method for fixing the gain of the amplification circuit 105 will be described next as a modification. The gain of the amplification circuit 105 is successfully fixed by controlling the gain of the amplification circuit 105 without performing comparison between the signal value of the amplified signal Vamp and the threshold Vth.

For example, comparison is not performed if at least one of the comparator CMP1, the D latch circuit DL, and the AND gate included in the control circuit 106 illustrated in FIG. 11 is not supplied with electric power. Thus, in the "1 H" period subsequent to the short-time exposure (second exposure period), power supply to at least one of the comparator CMP1, the D latch circuit DL, and the AND gate is stopped.

In this case, the OR gate is supplied with electric power and the control signal ϕLG is set to the H level in order to allow the determination signal ATT to have the H level. Alternatively, another circuit may supply the amplification circuit 105 and the memory 110D with a signal corresponding to the determination signal ATT having the H level.

Another method for fixing the gain of the amplification circuit 105 will be described as a modification. For example, the gain of the amplification circuit 105 is substantially fixed by changing the threshold Vth used in comparison. In this modification, the control circuit 106 illustrated in FIG. 4 may be used.

As described in FIG. 5, the gain of the amplification circuit 105 is controlled to be equal to the relatively low gain when the signal value of the amplified signal Vamp obtained by amplifying the pixel signal at a gain of 1 is greater than the threshold Vth. Thus, by setting the threshold Vth to be less than the signal value that the amplified signal Vamp can take, the determination signal ATT representing the result of the comparison is successfully set to the H level all the time. In addition, by setting the threshold Vth to be greater than the signal value that the amplified signal Vamp can take, the determination signal ATT is successfully set to the L level all the time.

As described above, the threshold Vth that is compared with the pixel signal based on electric charges produced by a long-time exposure (first exposure period) differs from the threshold Vth that is compared with the pixel signal based on electric charges produced by a short-time exposure (second exposure period). With such a method, the gain of the amplification circuit 105 is successfully fixed.

A relationship between the signal value of the pixel signal and the gain applied to the pixel signal changes in response to a change in the threshold Vth in a manner as described below. When the signal value of the pixel signal based on electric charges produced by the long-time exposure (first exposure period) is in a first range, the gain applied to the pixel signal is controlled to be equal to the relatively low gain (first gain). When the signal value of the pixel signal is in a second range that is on the lower luminance side of the first range, the gain applied to the pixel signal is controlled to be equal to the relatively high gain (second gain). In contrast, for the pixel signal based on electric charges produced in the short-time exposure (second exposure period), the relatively low gain (first gain) is used in both of the cases where the signal value of the pixel signal is in the first range and in the second range.

In the second embodiment, the gain applied to the pixel signal and the gain applied to the reset level signal are equal or substantially equal. From another viewpoint, the gain to be applied to a pixel signal is controlled to be equal to one of the plurality of gains before the pixel signal is output from the pixel 100. That is, once the gain of the amplification circuit 105 is controlled to be equal to the gain applied to the reset level signal, control for changing the gain is not performed. This is an aspect of fixing the gain.

While the modifications of the method for fixing the gain have been described above, the method for fixing the gain is not limited to the above examples.

In the case where the gain of the amplification circuit 105 is fixed as in the second embodiment, the signal stored in the memory 110D is known. Specifically, when the relatively high gain is used, the L level is stored in the memory 110D. When the relatively low gain is used, the H level is stored in the memory 110D.

Thus, for example, the determination signal ATT need not be stored in the memory 110D. In this case, since electric power used for writing in the memory 110D is saved, power consumption is successfully reduced. In addition, reading of the signal from the memory 110D may be omitted or skipped. Consequently, power consumption is successfully reduced. Since an amount of data output from the image pickup device IM1 reduces, the process can speed up.

As described above, in the second embodiment, comparison between the signal value of the amplified signal Vamp and the threshold Vth and gain control based on the result of the comparison are performed in a "1 H" period subsequent to a long-time exposure (first exposure period). On the other hand, when a pixel signal based on electric charges produced by a short-time exposure (second exposure period) is read, the gain of the amplification circuit 105 is fixed. With such a configuration, noise is successfully reduced.

Also in the second embodiment, correction based on the gain ratio, combination of images obtained in exposure periods of different durations, and correction based on the ratio between the durations of the exposure periods when the images are combined together are not mandatory to achieve an increased dynamic range or noise reduction because these processes can be performed by an external image processing unit not included in embodiments of the present invention.

Third Embodiment

A third embodiment will be described. In the third embodiment, the column signal processing units 104 have a configuration different from that of the column signal processing units 104 according to the first and second embodiments. Thus, part different from that of the first and second embodiments is mainly described below, and a description of part that is the same or substantially the same as that of the first or second embodiment is omitted.

Figure 15:
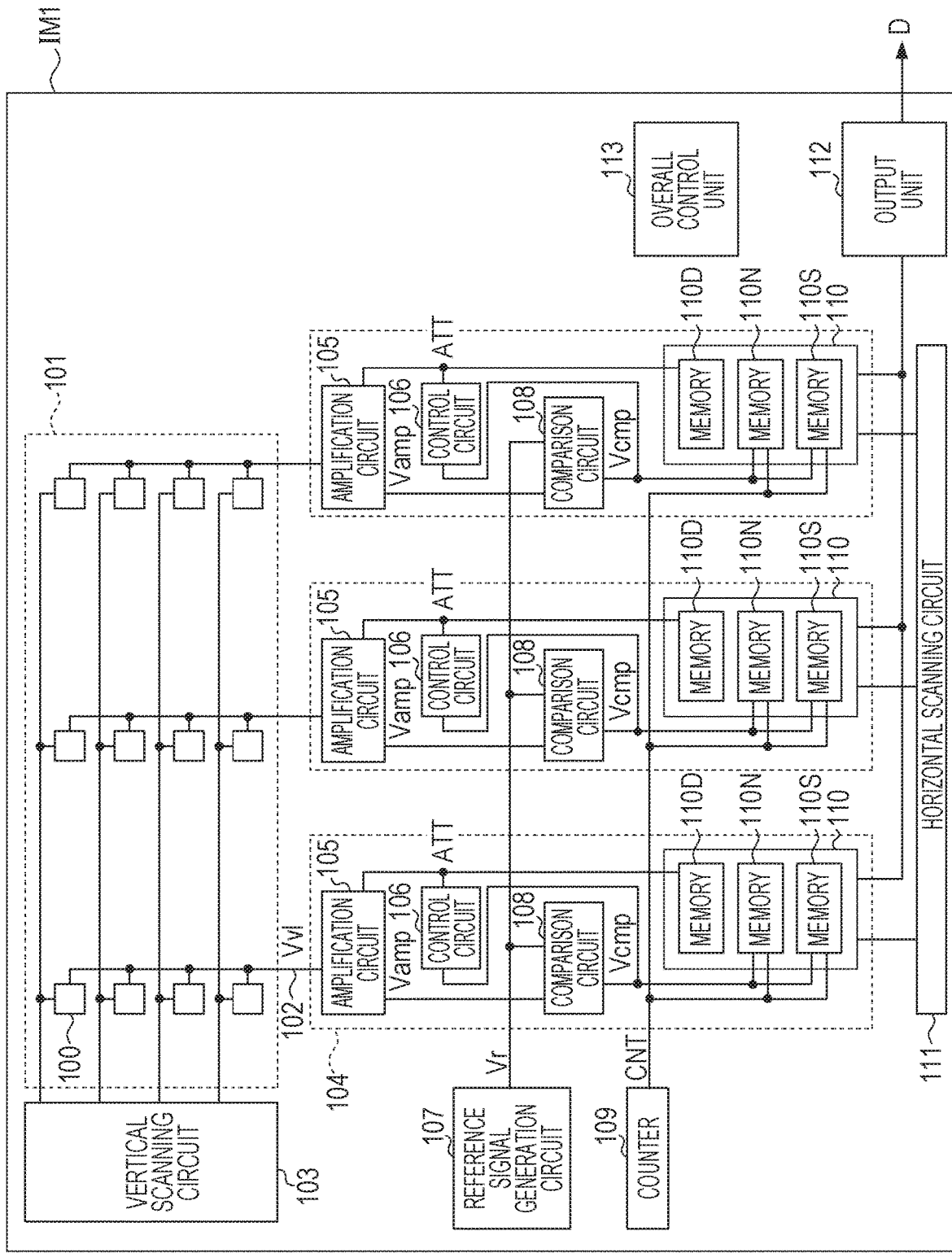
FIG. 15 is a diagram schematically illustrating an overall configuration of an image pickup device.

A configuration of an image pickup device IM1 according to the third embodiment will be described with reference to a circuit block diagram of FIG. 15. The configuration illustrated in FIG. 15 other than the column signal processing units 104 is the same or substantially the same as that of FIG. 1. Thus, the description given for FIG. 1 is entirely applied to part in FIG. 15 that is the same or substantially the same as FIG. 1 to omit a description of such part.

In FIG. 1, the amplified signal Vamp output from the amplification circuit 105 is input to the control circuit 106 and the comparison circuit 108. In contrast, in the third embodiment, the amplified signal Vamp is input to the comparison circuit 108 and an output node of the comparison circuit 108 is connected to the control circuit 106 as illustrated in FIG. 15. With such a configuration, the comparison circuit 108 compares the signal value of the amplified signal Vamp with the threshold Vth and compares the signal value of the amplified signal Vamp with the signal value of the reference signal for AD conversion.

Thus, the reference signal generation circuit 107 supplies a signal representing the threshold Vth to the comparison circuit 108 when the comparison circuit 108 compares the signal value of the amplified signal Vamp with the threshold Vth. In addition, the reference signal generation circuit 107 supplies a reference signal for AD conversion described in the first embodiment to the comparison circuit 108 when AD conversion is performed on the amplified signal Vamp.

Figure 16A:
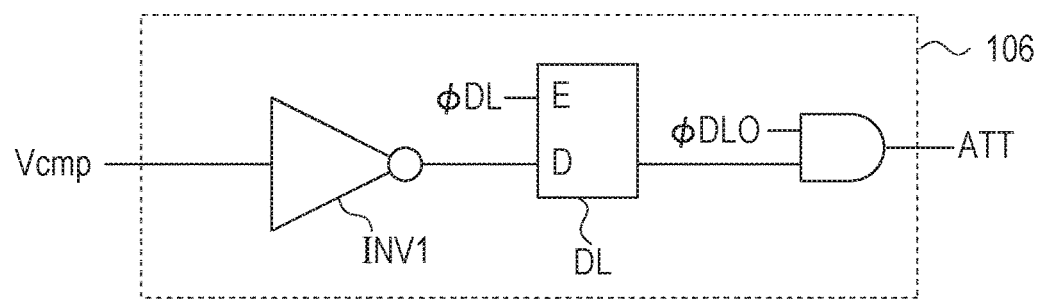
FIGS. 16A and 16B are diagrams each illustrating an equivalent circuit of a control circuit of the image pickup device.
Figure 16B:
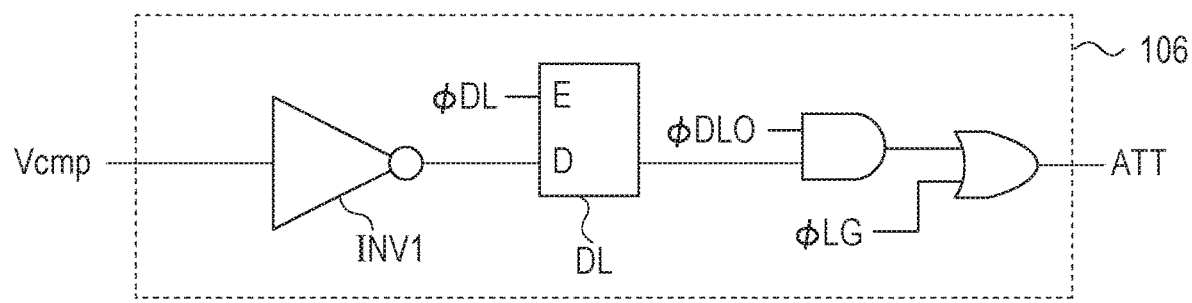

FIGS. 16A and 16B each illustrate an equivalent circuit of the control circuit 106. The control circuit 106 includes an inverter INV1, a D latch circuit DL, and an AND gate connected at a subsequent stage of the D latch circuit DL. As illustrated in FIG. 16B, the control circuit 106 may further include a logic gate at a subsequent stage of the AND gate. In contrast to FIG. 4 or 11, the inverter INV1 is provided in FIGS. 16A and 16B in place of the comparator CMP1. In the third embodiment, since the comparison circuit 108 compares the signal value of the amplified signal Vamp with the threshold Vth, the control circuit 106 need not include a comparator. As in the first and second embodiments, the determination signal ATT output from the control circuit 106 is input to the amplification circuit 105 and the memory 110D of the memory unit 110.

The rest of the configuration of the column signal processing units 104 is the same or substantially the same as that of the first or second embodiment. Thus, a detailed description thereof is omitted.

An operation of reading a pixel signal will be described next with reference to timing charts of FIGS. 17 and 18. The overall control unit 113 controls operations of the individual components, such as the vertical scanning circuit 103 and the horizontal scanning circuit 111, of the image pickup device IM1.

Figure 17:
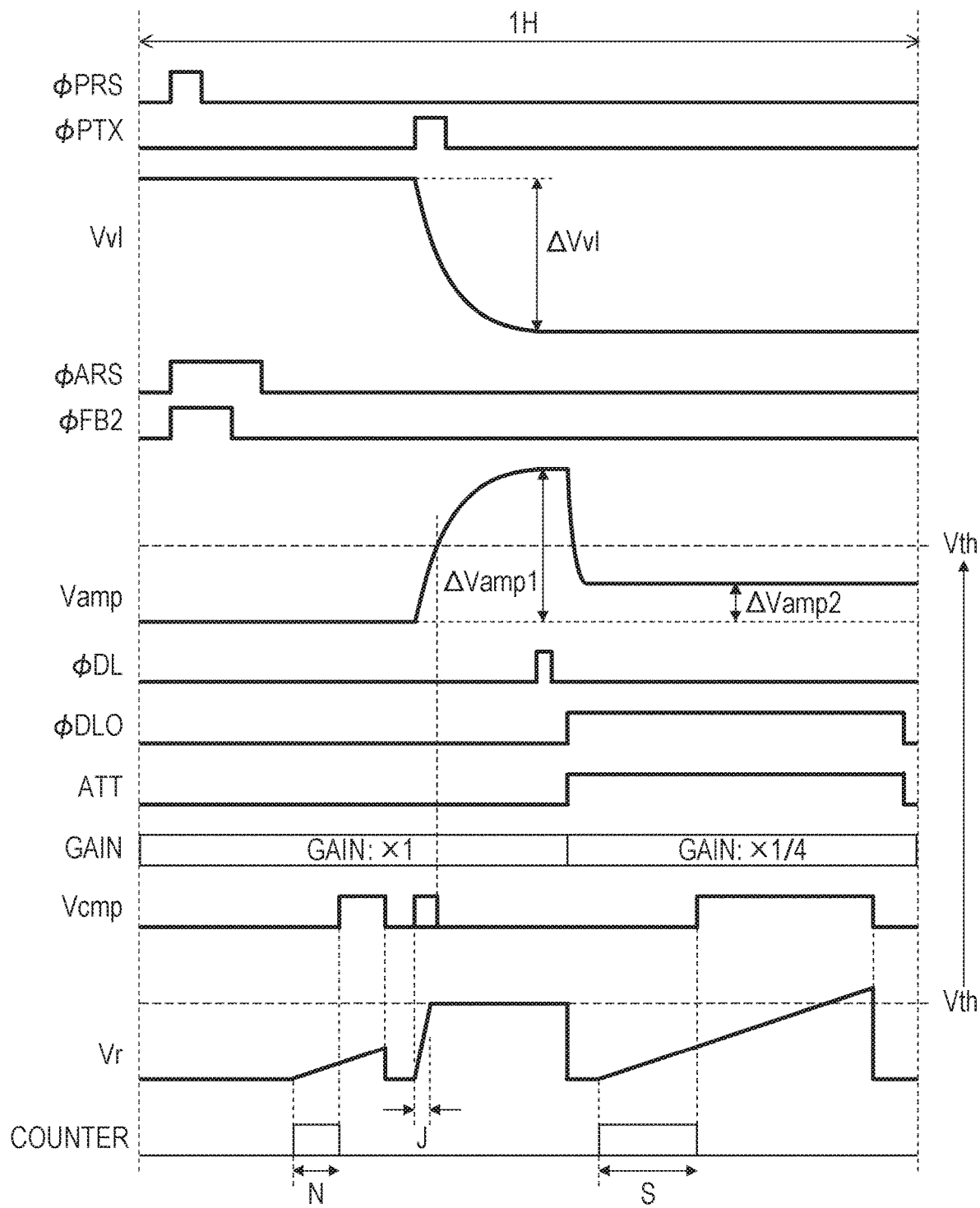
FIG. 17 is a timing chart schematically illustrating an operation of the image pickup device.
Figure 18:
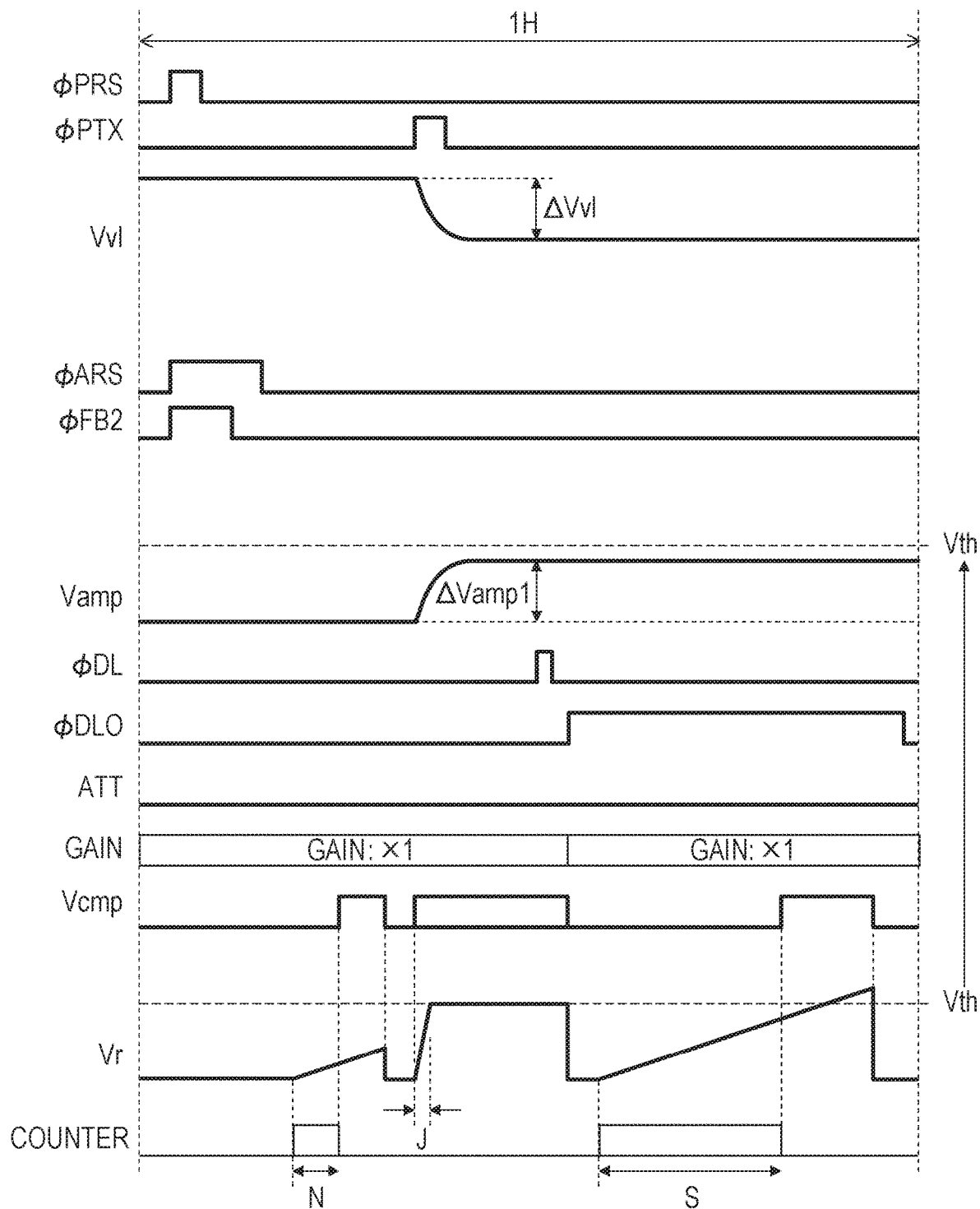
FIG. 18 is a timing chart schematically illustrating an operation of the image pickup device.

FIGS. 17 and 18 respectively correspond to FIGS. 5 and 6 according to the first embodiment. The timing chart of FIG. 17 indicates the case where the signal value of the amplified signal Vamp obtained by amplifying a pixel signal at a gain of 1 is greater than the threshold Vth. On the other hand, the timing chart of FIG. 18 indicates the case where the signal value of the amplified signal Vamp obtained by amplifying the pixel signal at the gain of 1 is less than the threshold Vth.

A difference of the third embodiment from the first embodiment is that the signal value of the reference signal Vr becomes equal to the threshold Vth in a period J located between the period in which AD conversion is performed on the reset level signal (arrow N in FIGS. 17 and 18) and the period in which AD conversion is performed on the pixel signal (arrow S in FIGS. 17 and 18). The rest of the operation is the same or substantially the same as that of FIGS. 5 and 6. Thus, the description of the first embodiment is incorporated by reference to omit a detailed description thereof.

In the period J, the signal value of the reference signal Vr output by the reference signal generation circuit 107 becomes equal to the threshold Vth. Since the control signal φPTX becomes equal to the H level in this period, electric charges are transferred in the pixel 100. As a result, a pixel signal is output from the pixel 100, and the amplified signal Vamp output by the amplification circuit 105 takes a signal value based on the pixel signal. The comparison circuit 108 receives the amplified signal Vamp and the reference signal Vr representing the threshold Vth. Thus, the comparison circuit 108 compares the signal value of the amplified signal Vamp with the threshold Vth.

In FIG. 17, the signal value of the amplified signal Vamp obtained by amplification using the gain of 1 is greater than the threshold Vth. Thus, the comparison signal Vcmp output from the comparison circuit 108 has the L level. In response to input of the comparison signal Vcmp having the L level to the control circuit 106, the control circuit 106 outputs the determination signal ATT having the H level. As a result, the gain of the amplification circuit 105 is controlled to be equal to ¼, which is the relatively low gain (first gain).

In FIG. 18, the signal value of the amplified signal Vamp obtained by amplification using the gain of 1 is less than the threshold Vth. Thus, the comparison signal Vcmp output from the comparison circuit 108 has the H level. In response to input of the comparison signal Vcmp having the H level to the control circuit 106, the control circuit 106 outputs the determination signal ATT having the L level. As a result, the gain of the amplification circuit 105 is controlled to be equal to 1, which is the relatively high gain (second gain).

The rest of the operation is the same or substantially the same as that of the first or second embodiment. Also in the third embodiment, the digital signal D based on electric charges produced by a long-time exposure (first exposure period) and the digital signal D based on electric charges produced by a short-time exposure (second exposure period) are read.

As in the first embodiment, the control circuit 106 may control the gain in accordance with the result of the comparison in both of the "1 H" period subsequent to the long-time exposure (first exposure period) and the "1 H" period subsequent to the short-time exposure (second exposure period). Such an operation is illustrated in FIG. 8. In FIG. 8, the signal value of the reference signal Vr is fixed in a period between the period in which AD conversion is performed on the reset level signal and the period in which AD conversion is performed on the pixel signal. In the third embodiment, however, the signal value of the reference signal Vr is set equal to the threshold Vth in this period as illustrated in FIG. 17 or 18.

Alternatively, as in the second embodiment, the control circuit 106 may fix the gain of the amplification circuit 105 in the "1 H" period subsequent to the short-time exposure (second exposure period). Such an operation is illustrated in FIG. 10. In FIG. 10, the signal value of the reference signal Vr is fixed in a period between the period in which AD conversion is performed on the reset level signal and the period in which AD conversion is performed on the pixel signal. In the third embodiment, the signal value of the reference signal Vr is set equal to the threshold Vth in this period as illustrated in FIG. 17 or 18. Examples of the method for fixing the gain at least include controlling the gain regardless of the result of the comparison between the signal value of the amplified signal Vamp and the threshold Vth, controlling the gain of the amplification circuit 105 without performing the comparison, and changing the threshold Vth used in comparison, as in the second embodiment.

As described above, the digital signals D based on electric charges produced by a long-time exposure (first exposure period) and the digital signals D based on electric charges produced by a short-time exposure (second exposure period) are read as in the first embodiment. When the digital signals D are read, the gain applied to a pixel signal output from the pixel 100 is controlled in accordance with comparison between the signal value of the pixel signal and the threshold Vth. With such a configuration, the dynamic range is successfully increased.

In addition, as in the second embodiment, comparison between the signal value of the amplified signal Vamp and the threshold Vth and gain control based on the comparison result are performed in the "1 H" period subsequent to the long-time exposure (first exposure period). On the other hand, when a pixel signal based on electric charges produced by the short-time exposure (second exposure period) is read, the gain of the amplification circuit 105 is fixed. With such a configuration, noise is successfully reduced.

In addition, in the third embodiment, the comparison circuit 108 compares the signal value of the amplified signal Vamp with the threshold Vth and compares the signal value of the amplified signal Vamp with the signal value of the reference signal Vr. Thus, the circuit scale is successfully reduced.

Fourth Embodiment

A fourth embodiment will be described. In the fourth embodiment, the column signal processing units 104 have a configuration different from that of the column signal processing units 104 according to the first to third embodiments. Thus, part different from that of the first to third embodiments is mainly described below, and a description of part that is the same or substantially the same as that of any of the first to third embodiments is omitted.

In the first to third embodiments, each of the column signal processing units 104 processes pixel signals by using a variable gain by changing the gain of the amplification circuit 105. In contrast, in the fourth embodiment, a conversion gain of AD conversion performed by the AD conversion unit is variable. Specifically, the reference signal generation circuit 107 outputs the plurality of reference signals Vr for which the signal value changes at different amounts of change per unit time. That is, the reference signal generation circuit 107 according to the fourth embodiment changes the slope of the ramp signal. With such a configuration, each of the column signal processing units 104 processes pixel signals by using a variable gain.

A configuration of an image pickup device IM1 according to the fourth embodiment will be described with reference to a circuit block diagram of FIG. 19. The configuration of the image pickup device IM1 according to the fourth embodiment is the same or substantially the same as those of the image pickup devices IM1 according to the first to third embodiments except for the configuration of the column signal processing units 104 and connections between the reference signal generation circuit 107 and the column signal processing units 104.

The pixels 100 and the amplification circuits 105 included in the respective column signal processing units 104 according to the fourth embodiment are the same or substantially the same as those of the first embodiment. That is, FIGS. 2 and 3 respectively illustrate equivalent circuits of each of the pixels 100 and the amplification circuit 105 according to the fourth embodiment. A description of FIGS. 2 and 3 is omitted. Note that the amplification circuit 105 according to the fourth embodiment need not have a variable gain. Thus, the switch S2 and the capacitor CFB2 illustrated in FIG. 3 may be omitted.

Figure 19:
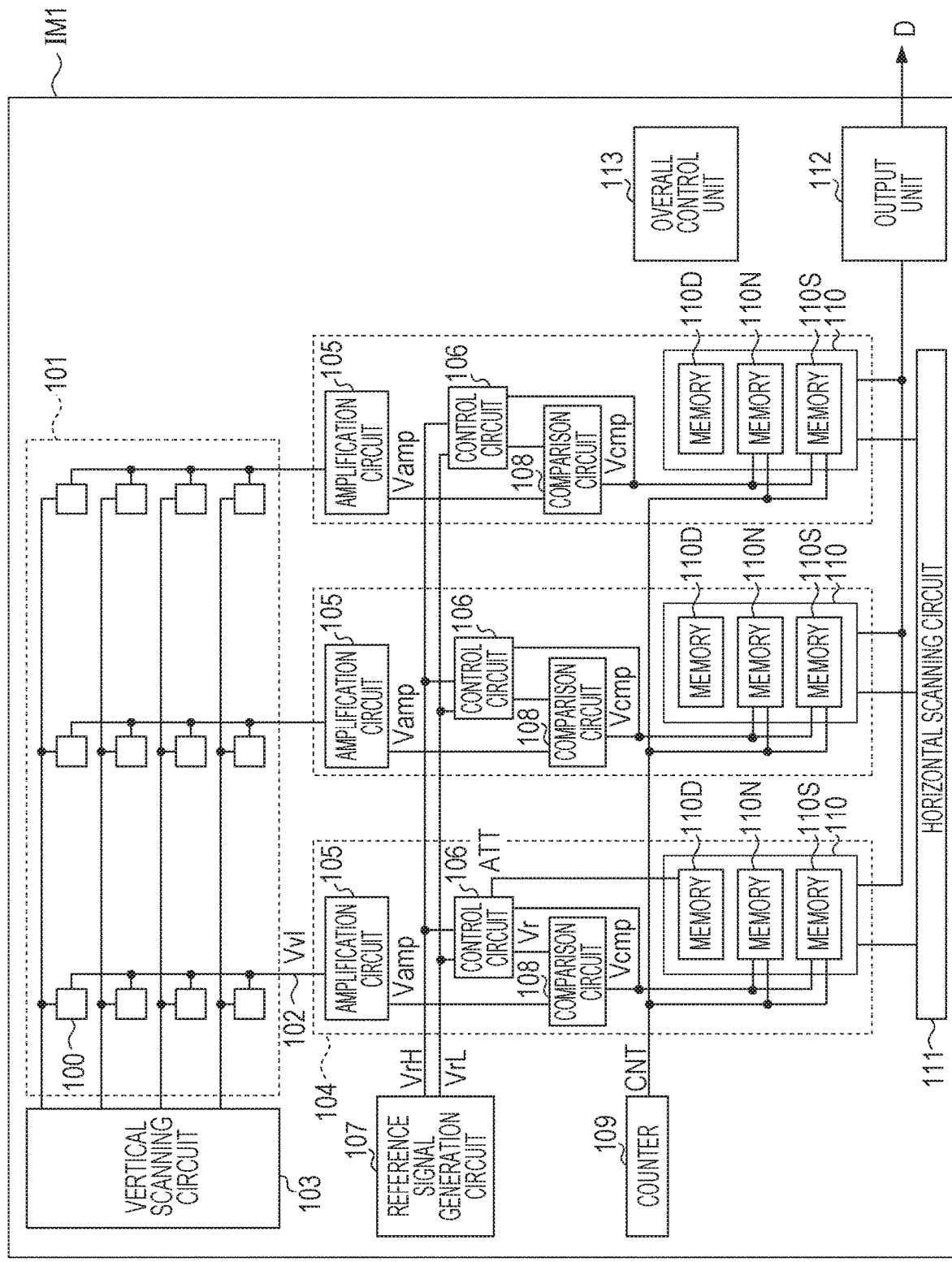
FIG. 19 is a diagram schematically illustrating an overall configuration of an image pickup device.

In the fourth embodiment, the amplified signal Vamp is input to the comparison circuit 108 and the output node of the comparison circuit 108 is connected to the control circuit 106 as illustrated in FIG. 19. Note that the amplified signal Vamp output by the amplification circuit 105 may be input to both of the comparison circuit 108 and the control circuit 106 as in the first or second embodiment.

The reference signal generation circuit 107 outputs a first reference signal VrL and a second reference signal VrH. The first reference signal VrL and the second reference signal VrH are input to the control circuits 106 through respective signal lines. The amount of change in the signal value of the second reference signal VrH per unit time is greater than the amount of change in the signal value of the first reference signal VrL per unit time. A ratio between the amounts of change of the two reference signals corresponds to the ratio between the AD conversion gains. The smaller the amount of change, the longer the time for the comparison signal Vcmp output by the comparison circuit 108 to invert from when the signal value of the reference signal Vr starts to change. That is, as the amount of change becomes smaller, the analog signal is converted into a digital signal having a larger signal value. Thus, as the amount of change in the signal value of the reference signal Vr per unit time becomes smaller, the AD conversion gain becomes higher. From another viewpoint, the smaller the amount of change, the finer the resolution per bit in AD conversion. That is, by increasing the AD conversion gain, the precision (resolution) of AD conversion can be improved.

The control circuit 106 outputs the determination signal ATT based on the comparison signal Vcmp output by the comparison circuit 108 as in the third embodiment. Further, the control circuit 106 according to the fourth embodiment selects one of the first reference signal VrL and the second reference signal VrH and outputs the selected reference signal Vr to the comparison circuit 108.

Figure 20:
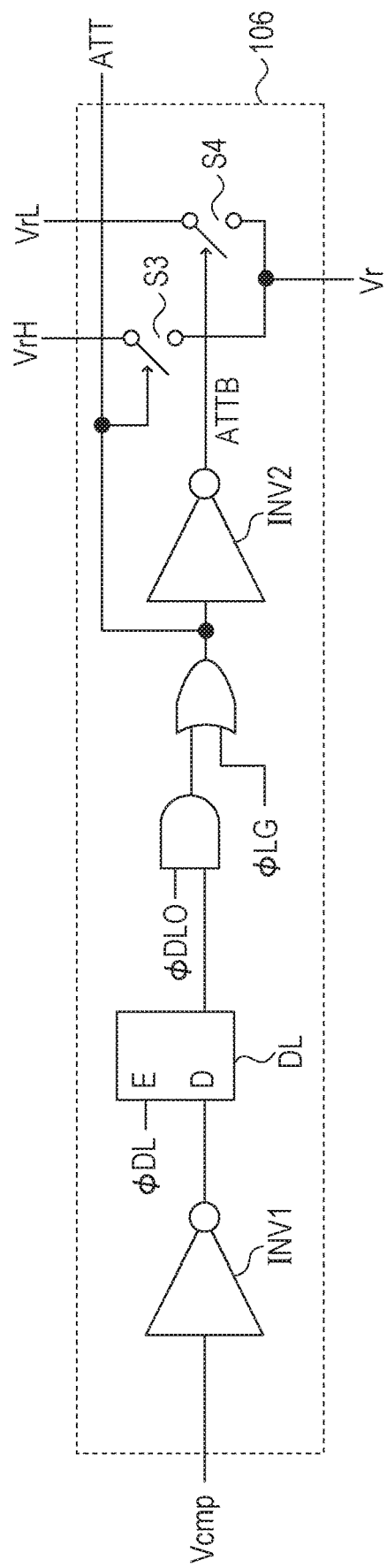
FIG. 20 is a diagram illustrating an equivalent circuit of a control circuit of the image pickup device.

FIG. 20 illustrates an equivalent circuit of the control circuit 106. The control circuit 106 includes the inverter INV1, the D latch circuit DL, the AND gate connected at a subsequent stage of the D latch circuit DL, and the OR gate connected at a subsequent stage of the AND gate. This configuration is the same as that illustrated in FIG. 16B. In a modification in which the output node of the amplification circuit 105 is connected to the control circuit 106, the control circuit 106 includes the comparator CMP1 illustrated in FIG. 1 or 11 in place of the inverter INV1.

The control circuit 106 according to the fourth embodiment further includes an inverter INV2, a switch S3, and a switch S4. The inverter INV2 inverts the determination signal ATT and outputs an inverted signal ATTB. The switch S3 is controlled in accordance with the determination signal ATT. When the determination signal ATT has the H level, the switch S3 is in the ON state. In response to the switch S3 being set in the ON state, the second reference signal VrH is output as the reference signal Vr from the control circuit 106. The switch S4 is controlled in accordance with the inverted signal ATTB. When the inverted signal ATTB has the H level, the switch S4 is in the ON state. In response to the switch S4 being set in the ON state, the first reference signal VrL is output as the reference signal Vr from the control circuit 106. Since the switches S3 and S4 operate complementarily, the control circuit 106 is able to select one of the first reference signal VrL and the second reference signal VrH.

An operation of the image pickup device IM1 will be described next with reference to FIGS. 21 and 22. The operation of the image pickup device IM1 is performed as a result of the overall control unit 113 controlling operations of the individual components of the image pickup device IM1. An operation of the pixels 100 are performed as a result of the overall control unit 113 controlling the vertical scanning circuit 103. In addition, digital signals are read from the memory unit 110 to the output unit 112 as a result of the overall control unit 113 controlling the horizontal scanning circuit 111.

Figure 21:
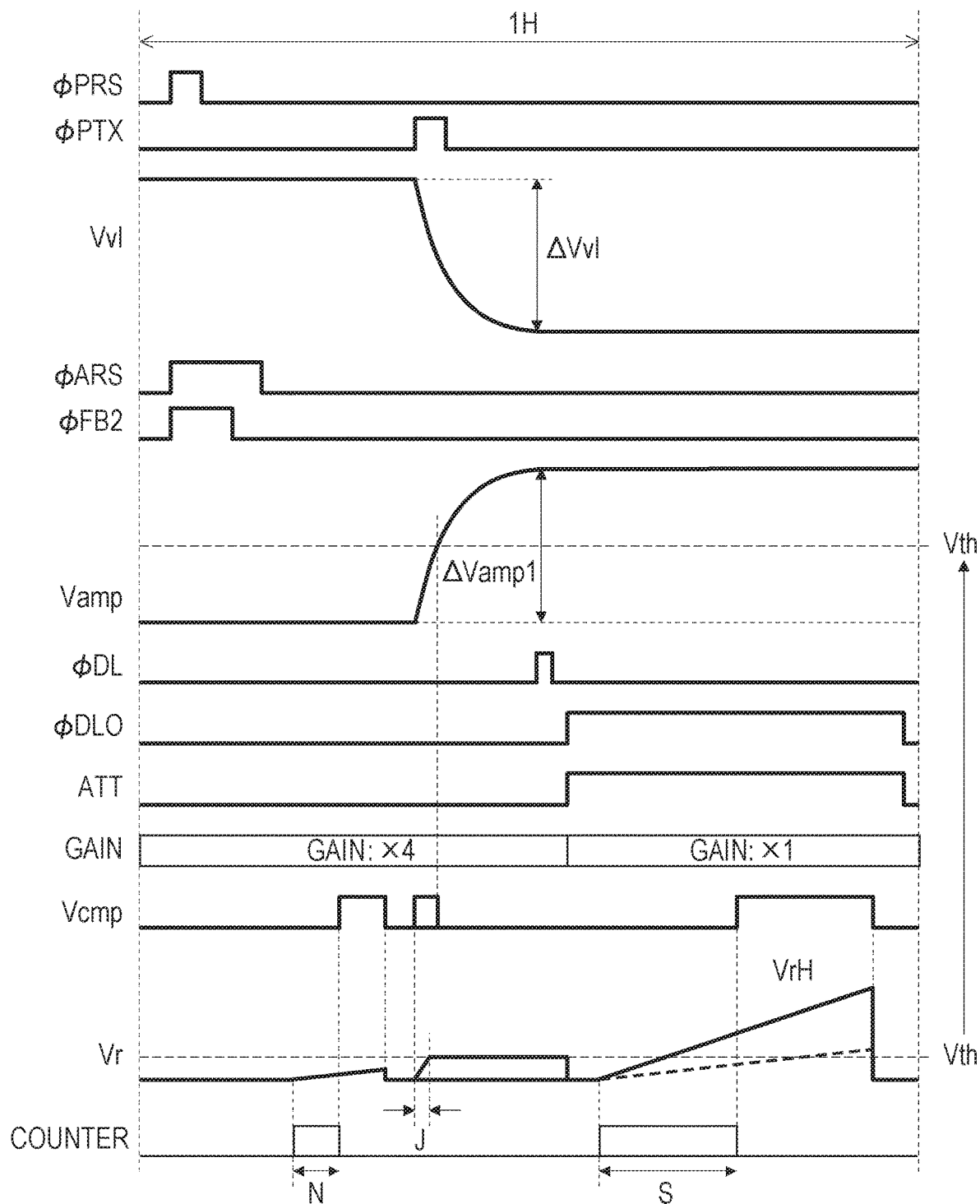
FIG. 21 is a timing chart schematically illustrating an operation of the image pickup device.

The timing chart of FIG. 21 indicates the case where the signal value of the amplified signal Vamp obtained by amplifying a pixel signal is greater than the threshold Vth. On the other hand, the timing chart of FIG. 22 indicates the case where the signal value of the amplified signal Vamp obtained by amplifying a pixel signal is less than the threshold Vth.

The operation up until transfer of electric charges is started is the same or substantially the same as that illustrated in FIG. 5. The vertical scanning circuit 103 maintains the control signal ϕPSEL supplied to each pixel 100 subjected to a pixel signal read operation at the H level and maintains the control signal ϕPSEL supplied to the other pixels 100 at the L level over the period illustrated in FIG. 5. The control signal ϕPSEL having the H level causes the amplification unit of the pixel 100 to output an analog signal (a pixel signal or a reset level signal) to the output line 102.

Then, the vertical scanning circuit 103 temporarily changes the control signal ϕPRS to the H level to reset the pixel 100. Consequently, the reset level signal is read to the output line 102. In parallel to resetting of the pixel 100, the overall control unit 113 temporarily changes the control signals ϕARS and ϕFB2 to the H level to reset electric charges accumulated in the capacitors CFB1, CFB2, and CIN. After the vertical scanning circuit 103 changes the control signal ϕPRS to the L level, the overall control unit 113 changes the control signals ϕARS and ϕFB2 to the L level.

At that time, the control signals ϕDLO and ϕLG have the L level. Thus, the determination signal ATT output by the control circuit 106 has the L level. On the other hand, the inverted signal ATTB has the H level. Since the switch S3 is set in the OFF state and the switch S4 is set in the ON state, the control circuit 106 outputs the first reference signal VrL.

Thereafter, the reference signal generation circuit 107 starts changing the signal value of the first reference signal VrL and the signal value of the second reference signal VrH at certain rates with respect to time in accordance with an instruction given thereto from the overall control unit 113. Note that the amount of change in the signal value of the first reference signal VrL per unit time and the amount of change in the signal value of the second reference signal VrH per unit time are different. Simultaneously with this, the counter 109 starts counting up the count value to be output from zero in accordance with an instruction given thereto from the overall control unit 113.

As described above, the control circuit 106 outputs the first reference signal VrL as the reference signal Vr. At a timing at which the comparison signal Vcmp changes from the L level to the H level as a result of the signal value of the reference signal Vr becoming greater than the signal of value the amplified signal Vamp, the memory 110N stores the count value output from the counter 109 at that timing. This count value corresponds to a digital signal converted from the reset level signal. Hereinafter, a digital signal converted from a reset level signal is referred to as a digital signal N.

Then, the vertical scanning circuit 103 temporarily changes the control signal ϕPTX to the H level, and consequently the transfer transistor MTX turns on. Up until this point, electric charges produced in a predetermined exposure period are accumulated in the photodiode PD. Thus, the electric charges accumulated in the photodiode PD are transferred to the floating diffusion FD. As a result, a pixel signal is read from the pixel 100 to the output line 102, and the output line signal Vvl has a signal value based on the pixel signal. Let ΔVvl denote an amount of change in the signal value of the output line signal Vvl after the electric charges are transferred, with respect to the signal value of the output line signal Vvl when the pixel 100 is in the reset state.

In parallel to the transfer of electric charges, the reference signal generation circuit 107 changes the signal value of the first reference signal VrH to the threshold Vth. Thus, the comparison circuit 108 is able to compare the signal value of the amplified signal Vamp based on the pixel signal with the threshold Vth. In the example illustrated in FIG. 21, the signal value of the amplified signal Vamp is greater than the threshold Vth. Thus, the comparison signal Vcmp output by the comparison circuit 108 has the L level. On the other hand, in the example illustrated in FIG. 22, the signal value of the amplified signal Vamp is less than the threshold Vth. Thus, the comparison signal Vcmp output by the comparison circuit 108 has the H level.

After a predetermined period passes from when the vertical scanning circuit 103 has changed the control signal ϕPTX to the L level, the overall control unit 113 temporarily changes the control signal ϕDL to the H level. Consequently, the D latch circuit DL stores the signal value based on the comparison signal Vcmp. Since the control circuit 106 includes the inverter INV1, the H level is stored in the D latch circuit DL when the signal value of the amplified signal Vamp is greater than the threshold Vth (FIG. 21). When the signal value of the amplified signal Vamp is less than the threshold Vth (FIG. 22), the L level is stored in the D latch circuit DL. Then, the overall control unit 113 changes the control signal ϕDLO to the H level. In FIG. 21, the determination signal ATT consequently has the H level. On the other hand, in FIG. 22, the determination signal ATT consequently has the L level.

Since the determination signal ATT has the H level in the example illustrated in FIG. 21, the control circuit 106 outputs the second reference signal VrH. Specifically, the switch S3 is set in the ON state and the switch S4 is set in the OFF state in the control circuit 106. Then, the reference signal generation circuit 107 starts changing the signal value of the second reference signal VrH. As described above, when the signal value of the amplified signal Vamp is greater than the threshold Vth, the relatively low conversion gain (first gain) is used to convert the pixel signal into a digital signal.

Figure 22:
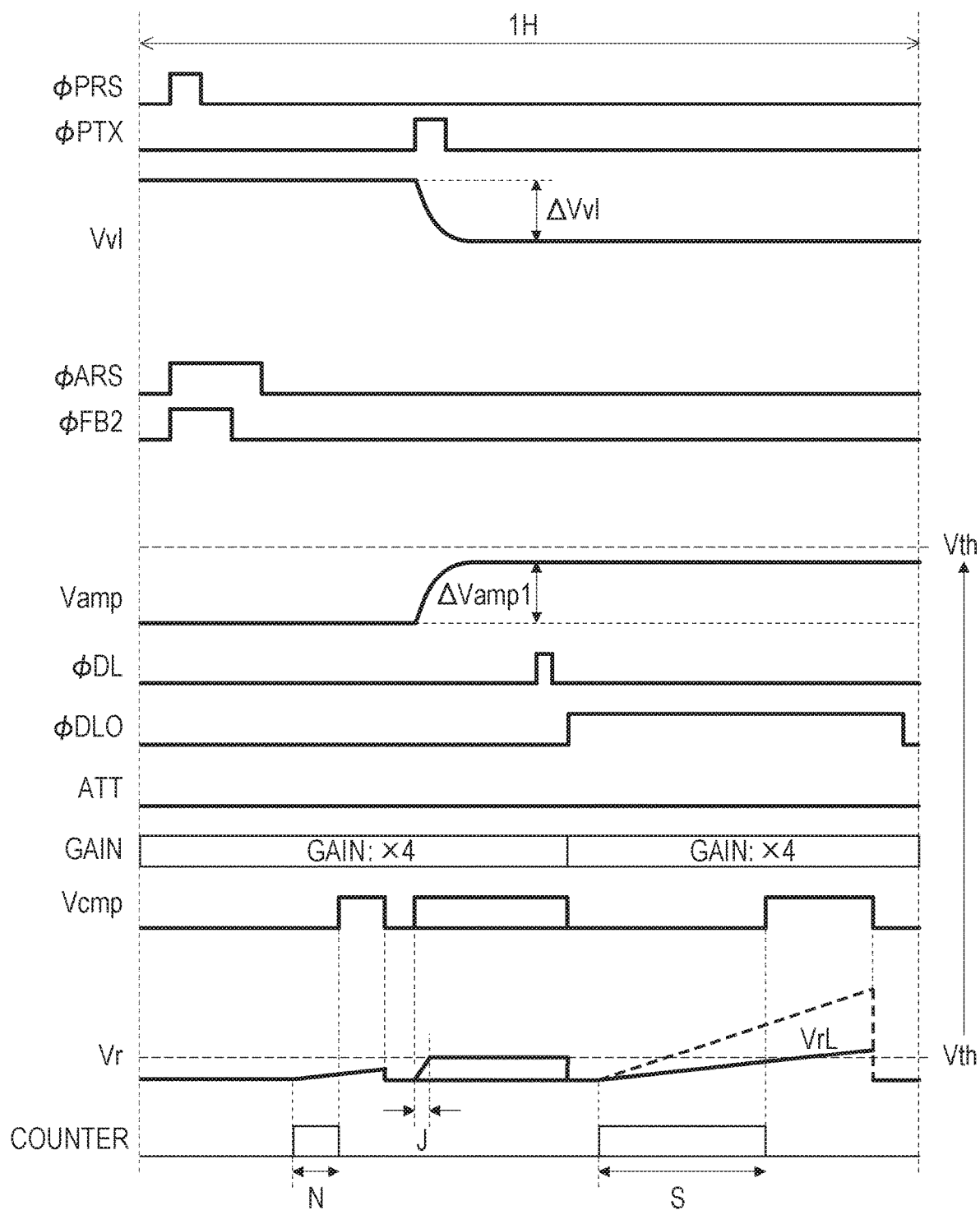
FIG. 22 is a timing chart schematically illustrating an operation of the image pickup device.

On the other hand, since the determination signal ATT has the L level in the example illustrated in FIG. 22, the control circuit 106 outputs the first reference signal VrL. Specifically, the switch S3 is set in the OFF state and the switch S4 is set in the ON state in the control circuit 106. Then, the reference signal generation circuit 107 starts changing the signal value of the first reference signal VrL. As described above, when the signal value of the amplified signal Vamp is less than the threshold Vth, the relatively high conversion gain (second gain) is used to convert the pixel signal into a digital signal.

In the fourth embodiment, the amount of change in the signal value of the second reference signal VrH per unit time is four times as large as the amount of change in the signal value of the first reference signal VrL per unit time. Thus, the ratio between the conversion gains is equal to 4. FIGS. 21 and 22 respectively illustrate the cases where the conversion gains are equal to 1 and 4 for convenience. However, the absolute values of the conversion gains do not have an essential meaning in terms of AD conversion.

The operation of the counter 109 according to the fourth embodiment is the same as that of the first embodiment. In addition, the signal value of the determination signal ATT, the digital signal N, and the digital signal S are stored in the memory 110D, the memory 110N, and the memory 110S, respectively, which is also the same as the first embodiment. Thus, a description thereof is omitted.

As described above, in the fourth embodiment, the reference signal generation circuit 107 outputs the first reference signal VrL and the second reference signal VrH having signal values that change at different amounts of change. Thus, the conversion gain of the AD conversion unit is variable. The rest of the configuration is the same or substantially the same as that of the first to third embodiments.

For example, a signal based on electric charges produced by a long-time exposure (first exposure period) and a signal based on electric charges produced by a short-time exposure (second exposure period) are read in order to increase the dynamic range. In both of these read operations, the conversion gain may be controlled based on the pixel signal. Alternatively, the conversion gain may be controlled based on the pixel signal in only one of these read operations, and the conversion gain may be controlled to be fixed in the other read operation.

With such a configuration, the dynamic range is successfully increased as in the first to third embodiments.

Fifth Embodiment

A fifth embodiment will be described. In the fifth embodiment, the column signal processing units 104 have a configuration different from that of the column signal processing units 104 according to the fourth embodiment. Thus, part different from that of the fourth embodiment is mainly described below, and a description of part that is the same or substantially the same as that of the fourth embodiment is omitted.

Figure 23:
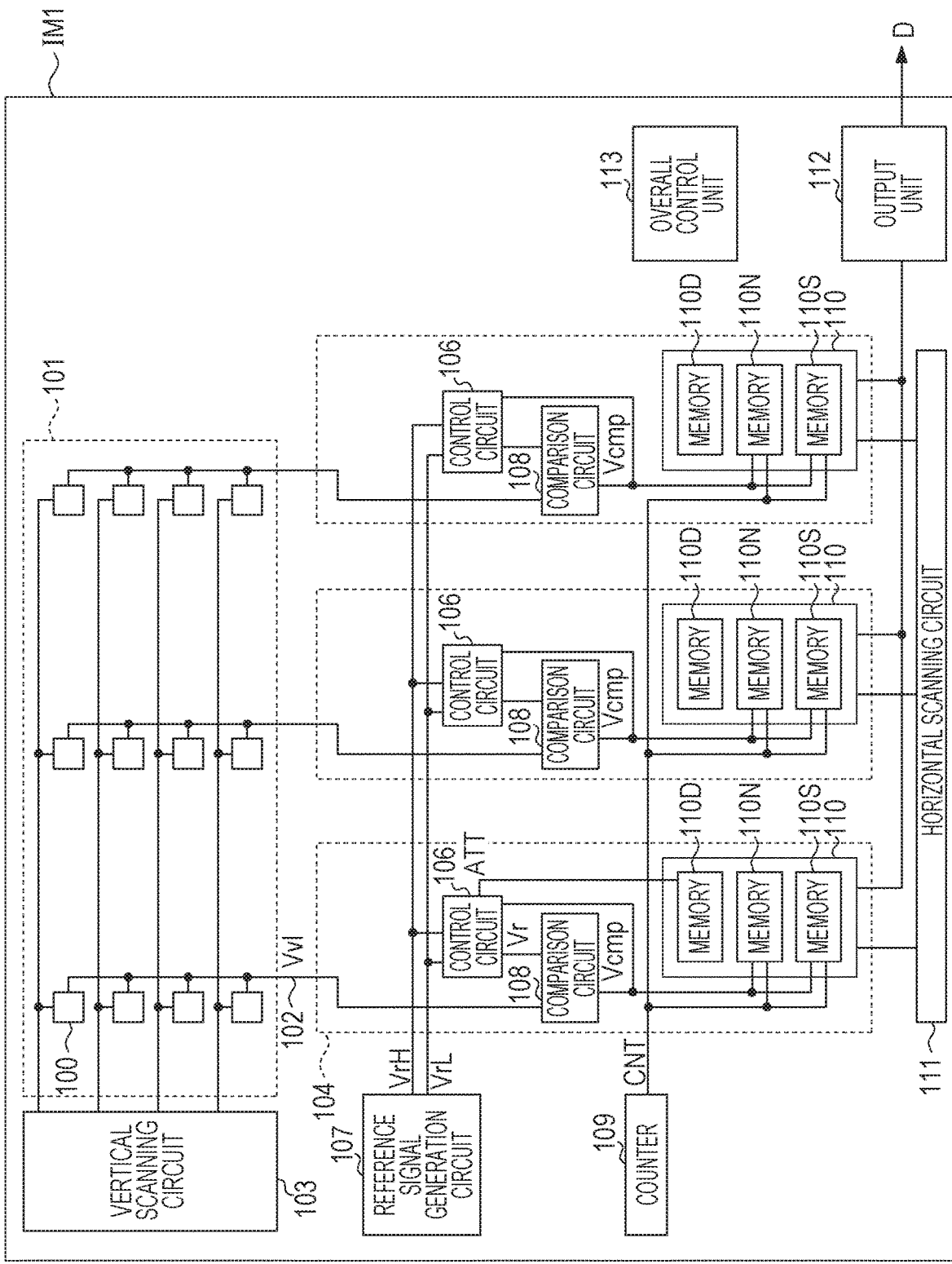
FIG. 23 is a diagram schematically illustrating an overall configuration of an image pickup device.

A configuration of an image pickup device IM1 according to the fifth embodiment will be described with reference to a circuit block diagram of FIG. 23. In the fifth embodiment, each of the column signal processing units 104 does not include the amplification circuit 105 illustrated in FIG. 1 or the like. Thus, the output line 102 is connected to the comparison circuit 108. With such a configuration, the output line signal Vvl (a pixel signal or a reset level signal) is input to the comparison circuit 108. The rest of the configuration is the same as that of the fourth embodiment.

Figure 24:
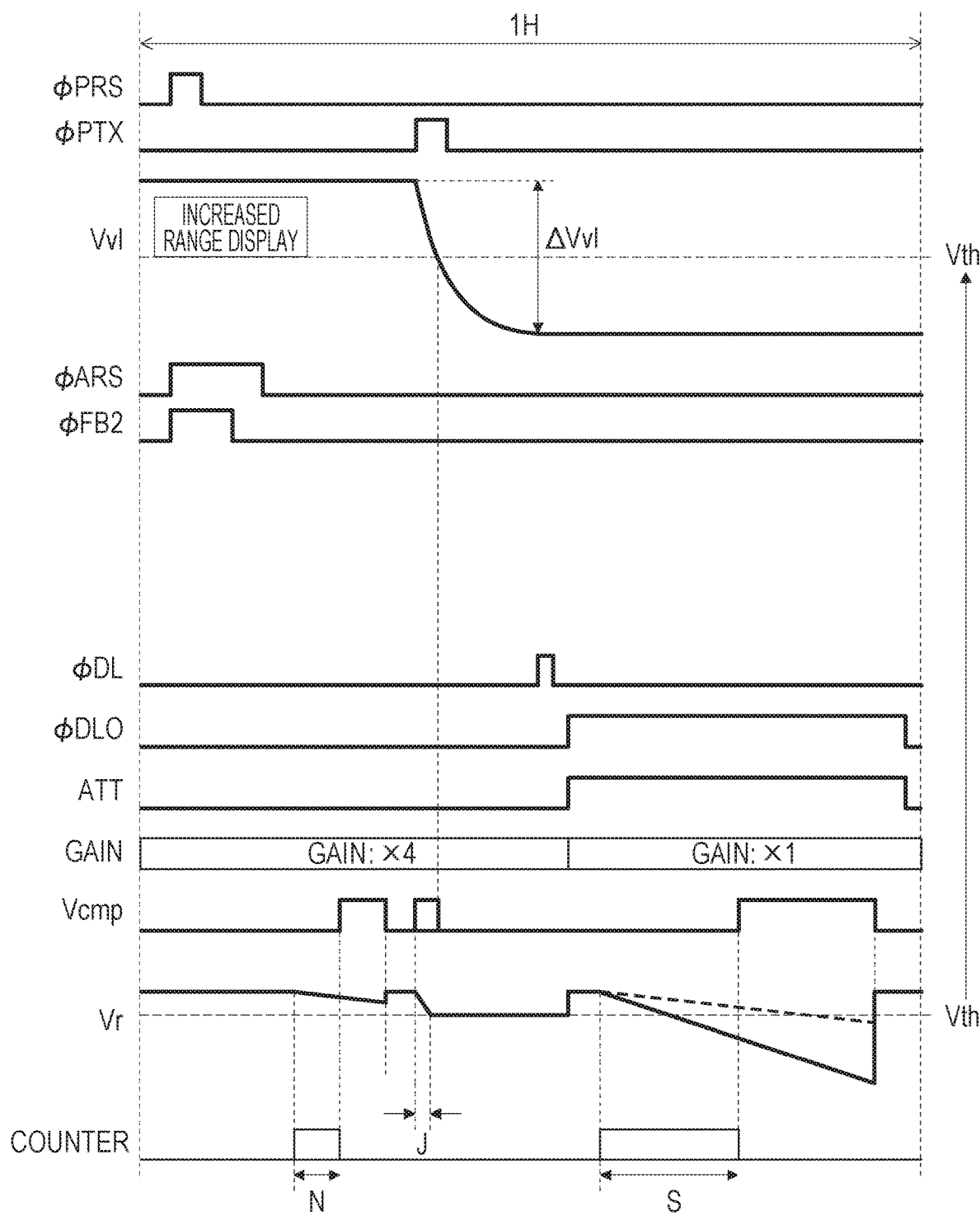
FIG. 24 is a timing chart schematically illustrating an operation of the image pickup device.
Figure 25:
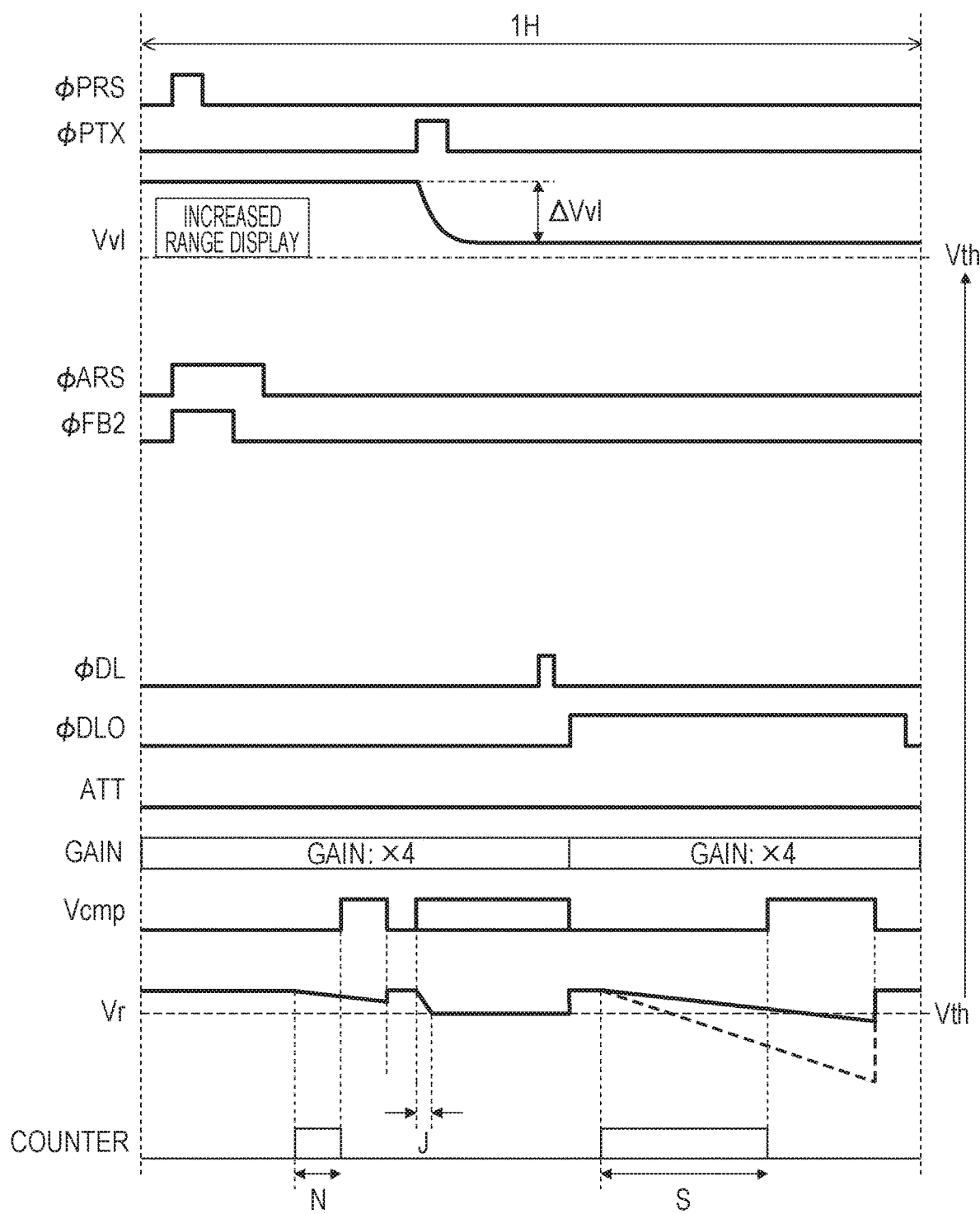
FIG. 25 is a timing chart schematically illustrating an operation of the image pickup device.

An operation of the image pickup device IM1 will be described next with reference to FIGS. 24 and 25. A difference of FIGS. 24 and 25 from FIGS. 21 and 22 is that the signal value of the reference signal Vr changes in the opposite direction. In the fourth embodiment, since the amplification circuit 105 includes the inverting amplifier AMP, the signal value of the amplified signal Vamp changes to increase (toward the H level) as a result of transfer of electric charges. In response to the change in the amplified signal Vamp, the signal value of the reference signal Vr also changes to increase. In contrast, in the fifth embodiment, the output line signal Vvl is input to the comparison circuit 108. The signal value of the output line signal Vvl changes to decrease (toward the L level) as a result of transfer of electric charges. Thus, in the fifth embodiment, the signal value of the reference signal Vr changes to decrease. Since the rest of the operation is the same or substantially the same as that of the fourth embodiment, a description thereof is omitted.

As described above, in the fifth embodiment, the reference signal generation circuit 107 outputs the first reference signal VrL and the second reference signal VrH having signal values that change at different amounts of change. Thus, the conversion gain of the AD conversion unit is variable. The rest of the configuration is the same or substantially the same as that of the first to third embodiments.

For example, a signal based on electric charges produced by a long-time exposure (first exposure period) and a signal based on electric charges generated by a short-time exposure (second exposure period) are read in order to increase the dynamic range. The conversion gain may be controlled based on the pixel signal in both of these read operations. Alternatively, the conversion gain may be controlled based on the pixel signal in only one of these read operations, and the conversion gain may be controlled to be fixed in the other read operation.

With such a configuration, the dynamic range is successfully increased as in the first to third embodiments.

Embodiment of Driving Method

An operation of obtaining a plurality of images, that is, an operation of capturing a moving image, performed by the image pickup devices IM1 according to the first to fifth embodiments will be described. In each of the embodiments, an operation of reading pixel signals from the respective pixels 100 constituting one row has been described (for example, in FIGS. 5 and 6 in the first embodiment). This read operation is sequentially performed for a plurality of rows of the pixels 100, and consequently an image is obtained.

Figure 28A:
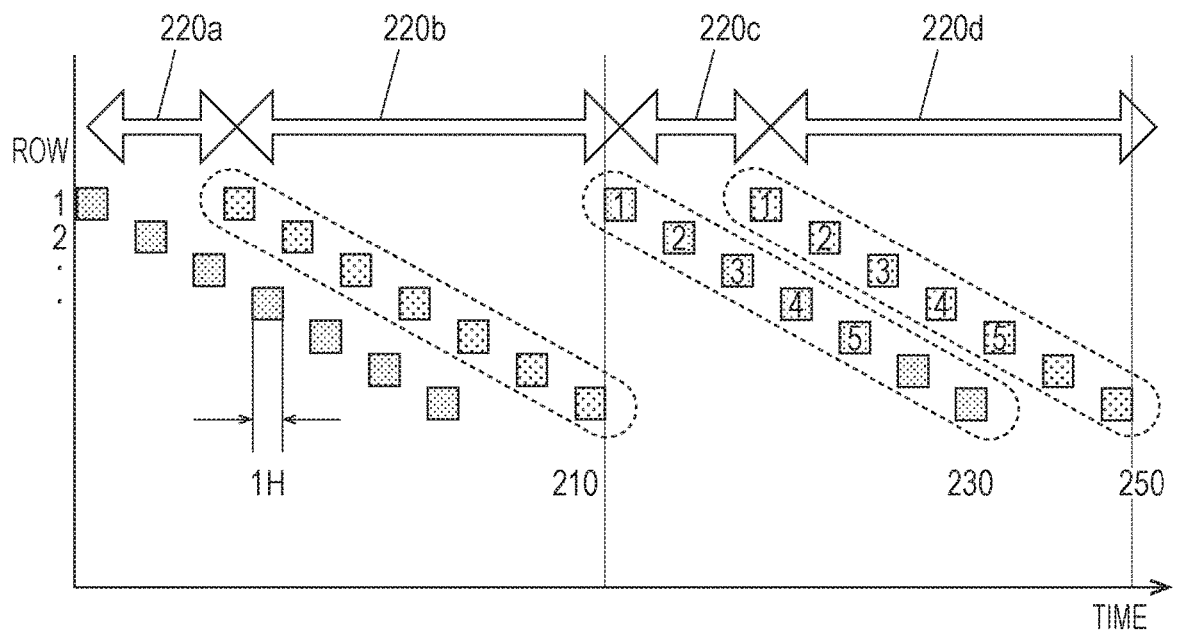
FIGS. 28A and 28B are diagrams schematically illustrating an operation of the image pickup device.

FIG. 28A schematically illustrates timings at which pixel signals of each row of the pixel array 101 are read. The vertical axis of FIG. 28A represents the row number, and the horizontal axis of FIG. 28A represents time.

FIG. 28A illustrates four periods 220a to 220d. In the period 220a, a short-time exposure is performed. In the period 220b, a long-time exposure is performed. In the period 220c, a short-time exposure is performed. In the period 220d, a long-time exposure is performed. Each quadrangle in FIG. 28A represents a single read operation of reading pixel signals. In addition, in this example, a photoelectric-conversion-unit reset operation for starting accumulation for the next exposure period is performed simultaneously with the read operation. For convenience, an operation of reading, from a row, pixel signals based on electric charges accumulated by an exposure performed in the period 220a is referred to as a read operation 210. Likewise, an operation of reading, from a row, pixel signals based on electric charges accumulated by an exposure performed in the period 220b is referred to as a read operation 230. An operation of reading, from a row, pixel signals based on electric charges accumulated by an exposure performed in the period 220c is referred to as a read operation 250. Each arrow in FIG. 28A indicates an exposure period of a row that is read first. In this embodiment, since a so-called slit rolling shutter operation is performed, exposure periods of different rows are shifted from one another.

A short-time exposure is performed in the period 220a. Signals based on signal charges accumulated in the period 220a are read by the read operation 210. The read operation 210 for each row is performed in the "1 H" period. An interval between the read operation 210 for one row and the read operation 210 for the next row corresponds to the "1 H" period.

The photoelectric conversion units are reset to start the next exposure period, simultaneously with reading of the pixel signals for each row. That is, the read operation 210 also serves as an operation for starting a long-time exposure performed in the period 220b. Signals based on signal charges accumulated in the period 220b are read by the read operation 230. At that time, an interval between the read operation 230 for one row and the read operation 230 for the next row is the "1 H" period. In addition, a short-time exposure performed in the next period 220c is started by the read operation 230.

Figure 28B:
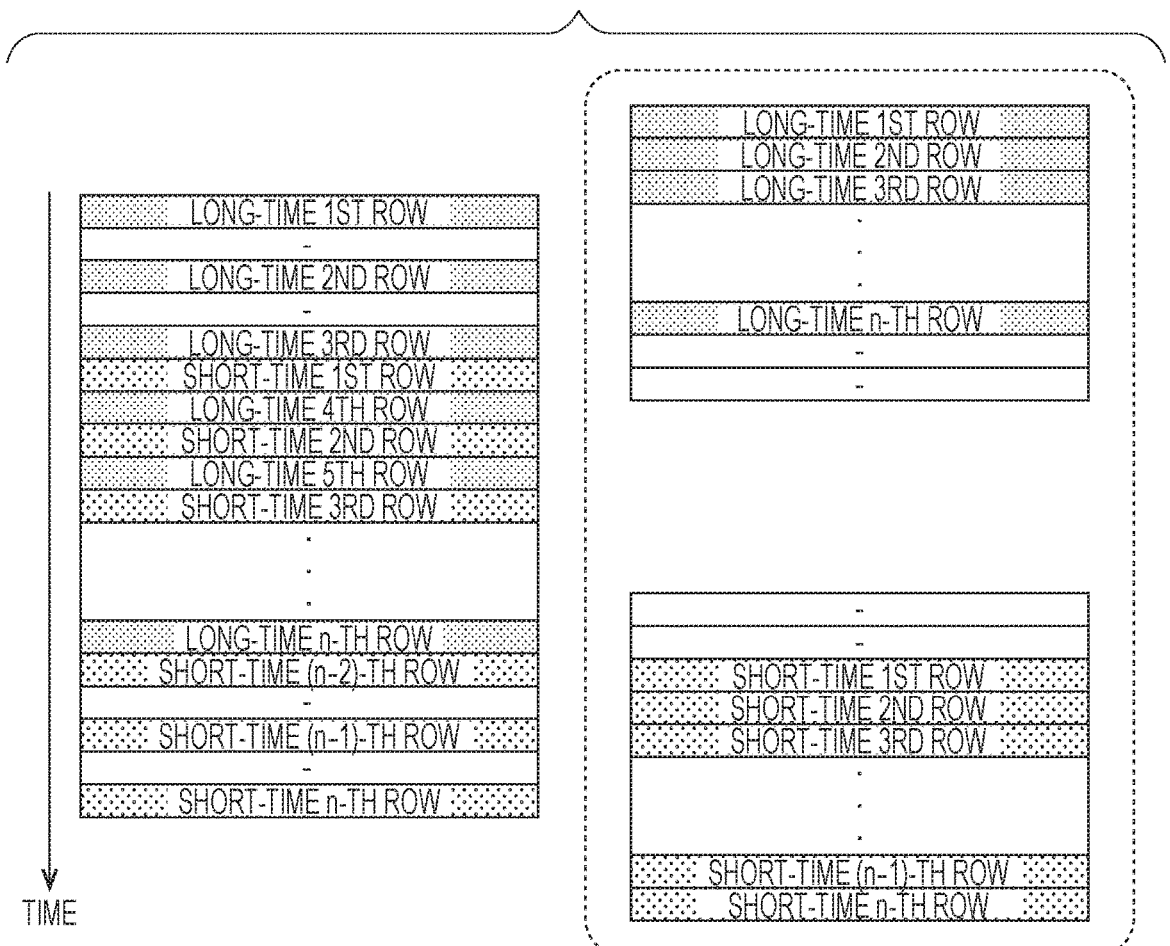

In the case of a short-time exposure, the read operation 250 is started before the read operation 230 is completed for all the rows because the exposure period is short. The read operation 250 for each row is performed between the read operation 230 for one row and the read operation 230 for the next row. Thus, when the pixel signals output from the image pickup device IM1 are arranged in time series, the order is as illustrated in FIG. 28B. In FIG. 28B, one block corresponds to the "1 H" period. At first, sets of pixel signals (corresponding to the long-time exposure) are consecutively output by the read operations 230 with an interval of the "1 H" period therebetween. Thereafter, a set of pixel signals (corresponding to the long-time exposure) output by the read operation 230 and a set of pixel signals (corresponding to the short-time exposure) output by the read operation 250 are alternately output. Lastly, sets of pixel signals (corresponding to the short-time exposure) are consecutively output by the read operations 250 with an interval of the "1 H" period therebetween. Note that two images are generated from these pixel signals as indicated by a dotted line in FIG. 28B by a signal processing unit provided at a subsequent stage.

With the operations described above, the exposure period of a short-time exposure is successfully reduced because the pixel signals of the next image can be read before reading of the pixel signals of the previous image is completed even if the exposure period is short. As a result, a wider dynamic range can be implemented.

Sixth Embodiment

Figure 26:
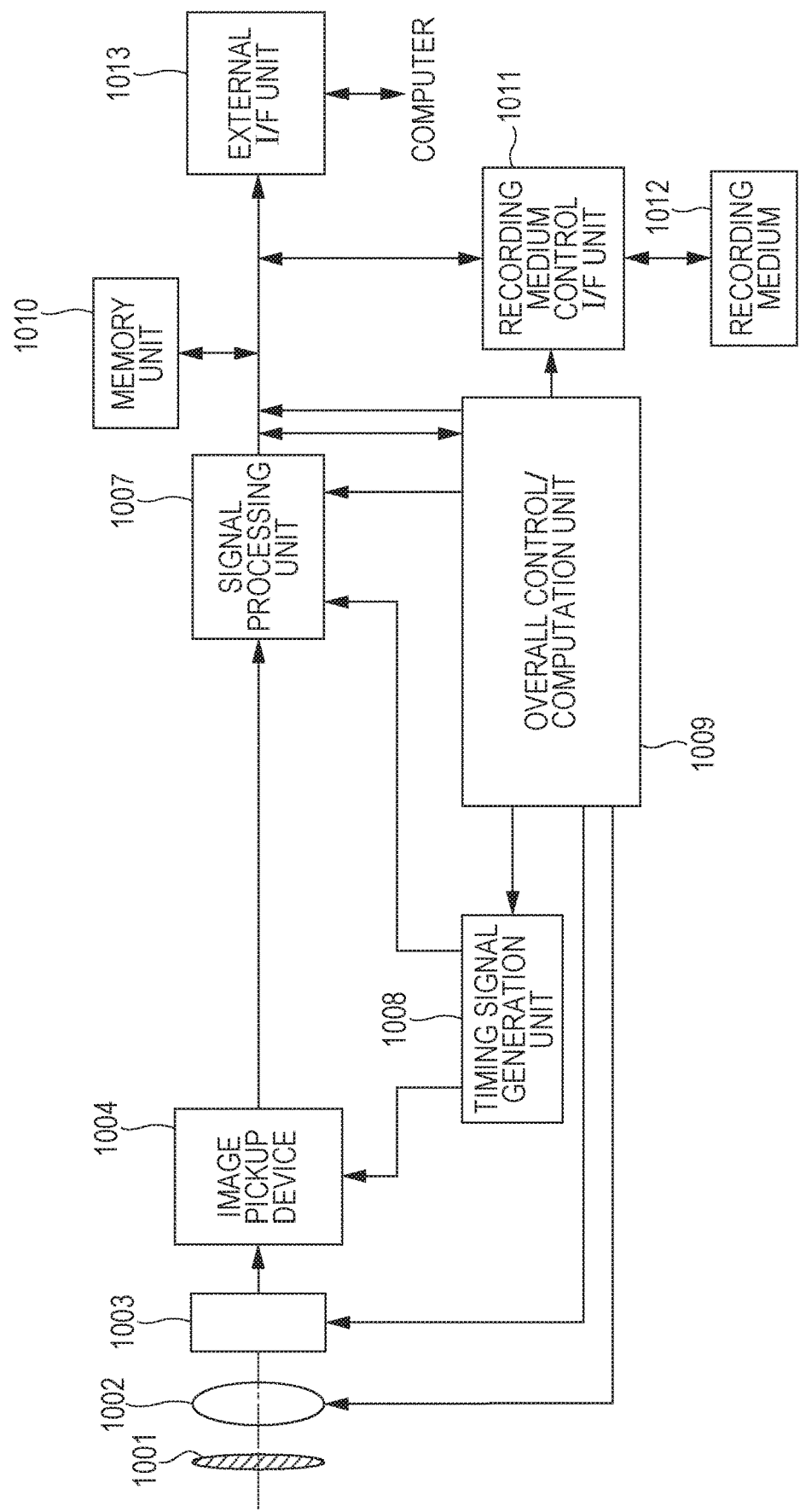
FIG. 26 is a block diagram of an image capturing system according to an embodiment.

An embodiment of an image capturing system will be described as a sixth embodiment. Examples of the image capturing system include a digital still camera, a digital camcorder, a camera head, a copier, a fax, a mobile phone, an onboard camera, and an observation satellite. FIG. 26 is a block diagram of a digital still camera which is an example of the image capturing system.

Referring to FIG. 26, a barrier 1001 protects a lens 1002. The lens 1002 focuses an optical image of a subject onto an image pickup device 1004. A diaphragm 1003 changes an amount of light that has passed through the lens 1002. As the image pickup device 1004, the image pickup device described in any of the above embodiments is used.

A signal processing unit 1007 performs processing, such as correction and data compression, on pixel signals output from the image pickup device 1004 to obtain an image signal. A timing signal generation unit 1008 outputs various timing signals to the image pickup device 1004 and the signal processing unit 1007. An overall control/computation unit 1009 controls the entire digital still camera. A memory unit 1010 temporarily stores image data. A recording medium control interface (I/F) unit 1011 performs recording or reading of data on a removable recording medium 1012, such as a semiconductor memory on which captured image data is recorded or from which the image data is read. An external I/F unit 1013 enables communication with an external computer.

Note that the image capturing system is just required to include at least the image pickup device 1004 and the signal processing unit 1007 that processes pixel signals output from the image pickup device 1004. In such a case, the other components are provided outside the image capturing system.

As described above, in the embodiment of the image capturing system, the image pickup device IM1 according to any one of the first to fifth embodiments is used as the image pickup device 1004. With such a configuration, the dynamic range of an image obtained by the image pickup device 1004 is successfully increased.

Seventh Embodiment

Figure 27A:
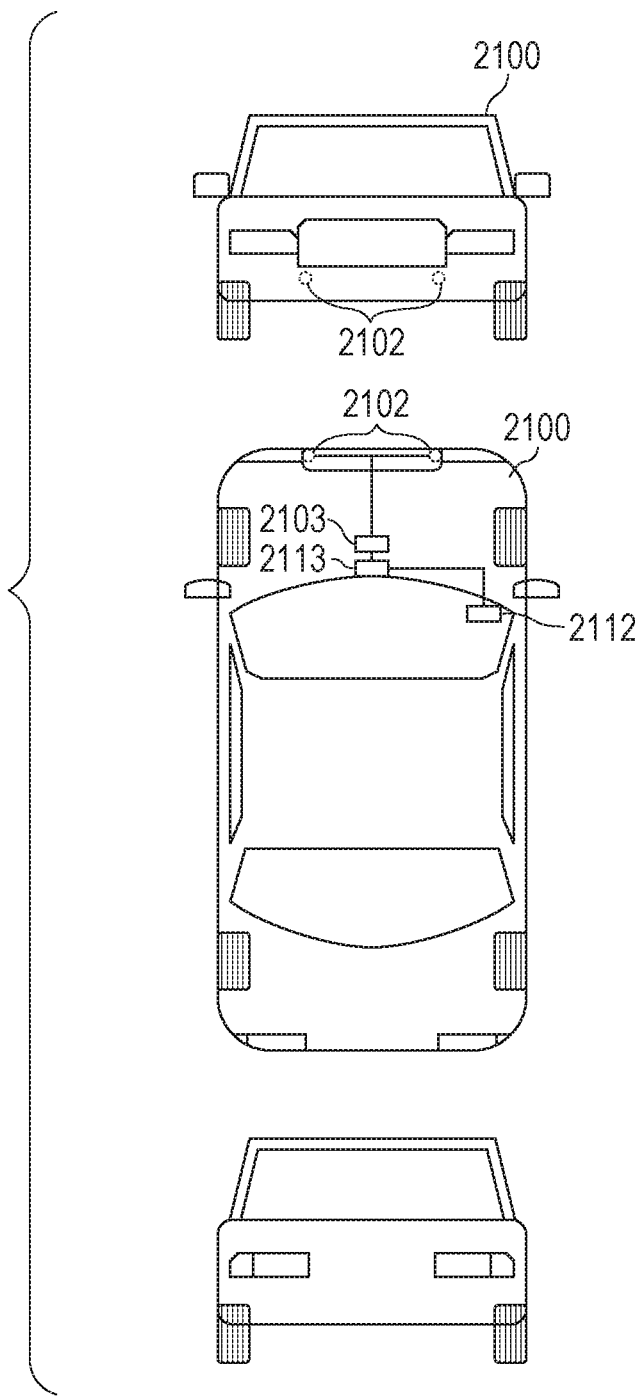
FIGS. 27A and 27B are a schematic diagram and a block diagram of a movable body according to an embodiment, respectively.

An embodiment of a movable body will be described. A movable body according to a seventh embodiment is an automobile equipped with an onboard camera. FIG. 27A schematically illustrates an appearance and major internal components of an automobile 2100. The automobile 2100 includes image pickup devices 2102, an image capturing system integrated circuit (Application Specific Integrated Circuit, ASIC) 2103, a warning device 2112, and a main control unit 2113.

The image pickup device described in any of the above embodiments is used as the image pickup devices 2102. The warning device 2112 issues a warning to a driver upon receipt of a signal indicating an abnormal event from an image capturing system, a vehicle-mounted sensor, or a control unit. The main control unit 2113 integrally controls operations of the image capturing system, the vehicle-mounted sensors, the control units, etc. The automobile 2100 need not necessarily include the main control unit 2113. In such a case, the image capturing system, the vehicle-mounted sensors, and the control units individually have communication interfaces and send/receive control signals via a communication network (based on a controller area network (CAN) standard, for example).

Figure 27B:
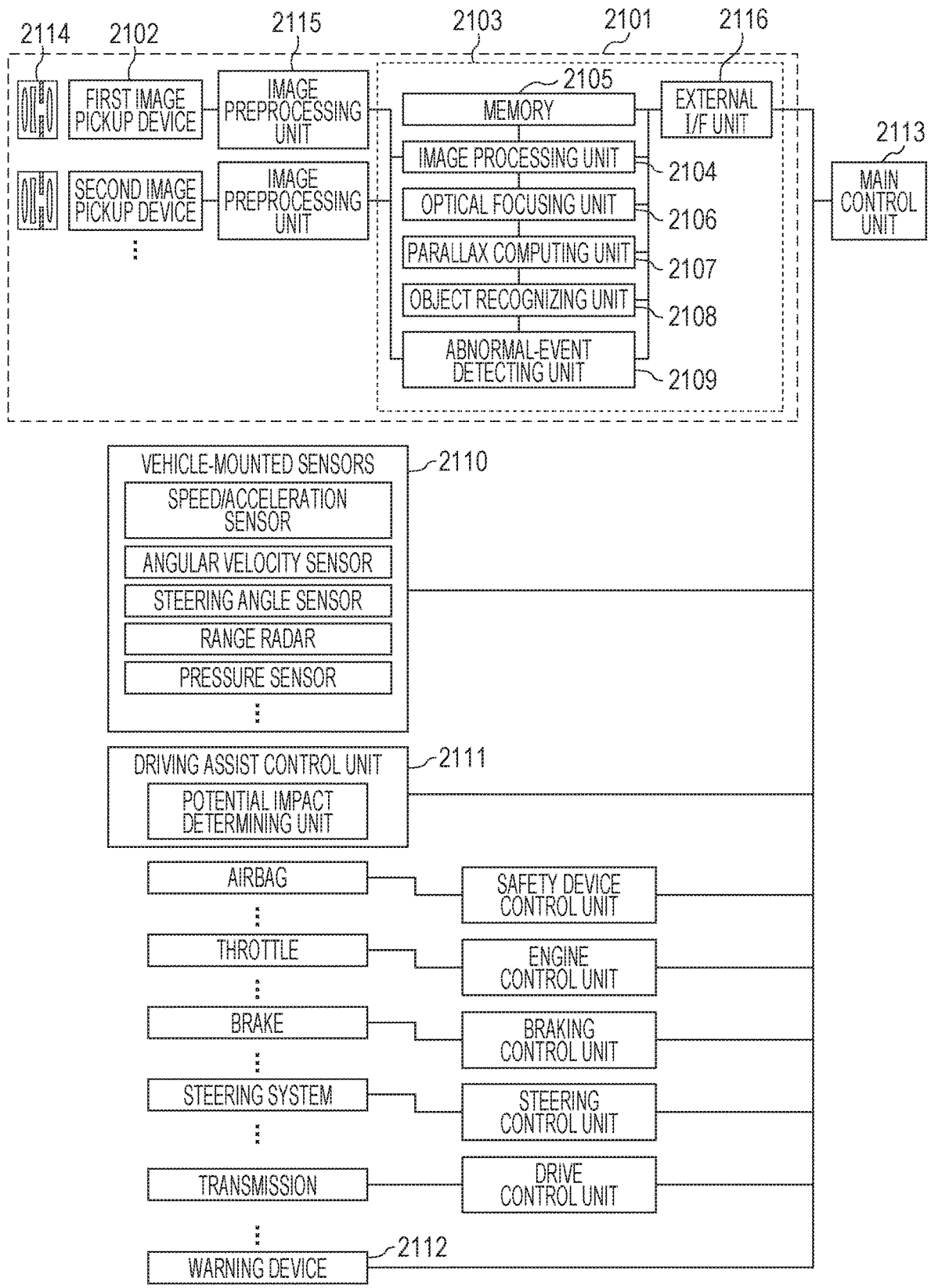

FIG. 27B is a block diagram illustrating a system configuration of the automobile 2100. The automobile 2100 includes the image pickup devices (a first image pickup device and a second image pickup device) 2102. That is, the onboard camera used in the seventh embodiment is a stereo camera. An image of a subject is focused onto each of the image pickup devices 2102 through an optical unit 2114. Pixel signals output from each of the image pickup devices 2102 are processed by an image preprocessing unit 2115 and are then sent to the image capturing system integrated circuit 2103. The image preprocessing unit 2115 performs processing such as S-N computation and addition of a synchronous signal.

The image capturing system integrated circuit 2103 includes an image processing unit 2104, a memory 2105, an optical focusing unit 2106, a parallax computing unit 2107, an object recognizing unit 2108, an abnormal-event detecting unit 2109, and an external interface (I/F) unit 2116. The image processing unit 2104 processes pixel signals to generate an image signal. The image processing unit 2104 also performs correction of the image signal and complementation for an abnormal pixel. The memory 2105 temporarily stores the image signal. The memory 2105 may also store the position of the known abnormal pixel of the image pickup device 2102. The optical focusing unit 2106 performs focusing of the subject or measurement of a distance to the subject by using the image signal. The parallax computing unit 2107 performs matching (stereo matching) of subjects in parallax images. The object recognizing unit 2108 analyzes the image signal to recognize a subject, such as an automobile, a person, a sign, or a road. The abnormal-event detecting unit 2109 detects a failure or a malfunction of the image pickup devices 2102. Upon detecting a failure or a malfunction, the abnormal-event detecting unit 2109 sends a signal indicating detection of an abnormal event to the main control unit 2113. The external I/F unit 2116 mediates information exchange between each unit of the image capturing system integrated circuit 2103 and the main control unit 2113 and various control units or the like.

The automobile 2100 further includes a vehicle information obtaining unit (vehicle-mounted sensors) 2110 and a driving assist control unit 2111. The vehicle information obtaining unit 2110 includes vehicle-mounted sensors, such as a speed/acceleration sensor, an angular velocity sensor, a steering angle sensor, a range radar, and a pressure sensor.

The driving assist control unit 2111 includes a potential impact determining unit. The potential impact determining unit determines a possibility of an impact of the automobile 2100 with an object on the basis of information from the optical focusing unit 2106, the parallax computing unit 2107, and the object recognizing unit 2108. The optical focusing unit 2106 and the parallax computing unit 2107 are an example of a distance information obtaining unit that obtains distance information regarding a distance to an object. That is, the distance information is information regarding parallax, an amount of defocusing, a distance to an object, or the like. The potential impact determining unit may determine a possibility of an impact by using any of these pieces of distance information. The distance information obtaining unit may be implemented by hardware designed for this purpose or by a software module.

The description has been given of the example in which the driving assist control unit 2111 controls the automobile 2100 to avoid an impact between the automobile 2100 and another object. Alternatively, the driving assist control unit 2111 may be used for controlling the automobile 2100 to perform automated driving by following another vehicle or for controlling the automobile 2100 to perform automated driving so that the automobile 2100 keeps in the lane.

The automobile 2100 further includes an airbag and units driven for traveling, such as a throttle, a brake, a steering system, and a transmission. The automobile 2100 also includes control units for the airbag and these driven units, specifically, a safety device control unit, an engine control unit, a braking control unit, a steering control unit, and a driving control unit. These control units control the airbag and the respective drive units in accordance with control signals from the main control unit 2113.

The image capturing system according to the seventh embodiment is not limitedly used in automobiles but can be used in movable bodies (movable apparatuses), such as a ship, an aircraft, and an industrial robot. In addition, the image capturing system is not limitedly used in a movable body but can be used in a wide variety of devices that recognize an object, such as an intelligent transportation system (ITS).

As described above, the image pickup device according to any one of the first to fifth embodiments is used as the image pickup devices 2102 in the embodiment of the automobile. With such a configuration, the dynamic range of images obtained by the image pickup devices 2102 is successfully increased.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-254390, filed Dec. 27, 2016 and No. 2017-202136 filed Oct. 18, 2017, which are hereby incorporated by reference herein in their entirety.

What is claimed is:

1. An image pickup device comprising:
   a plurality of pixels each configured to output an analog signal based on electric charges produced in a photoelectric conversion unit;
   a control unit configured to control a gain applied to the analog signal to be at least a first gain and a second gain greater than the first gain in accordance with a signal value of the analog signal; and
   a signal processing unit configured to process, by using a variable gain, the analog signal output from the pixel,
   wherein each of the plurality of pixels outputs, as the analog signal, a first signal based on electric charges produced in the photoelectric conversion unit in a first exposure period and a second signal based on electric charges produced in the photoelectric conversion unit in a second exposure period shorter than the first exposure period,
   wherein the control unit controls the gain applied to the analog signal by selecting one from the first gain and the second gain in accordance with the signal value, for at least one of the first signal and the second signal,
   wherein the control unit controls, as the gain applied to the analog signal, the variable gain used by the signal processing unit to be at least the first gain and the second gain,
   wherein each of the plurality of pixels includes
      an amplification unit having an input node configured to receive the electric charges, and
      a reset unit configured to reset voltage of the input node,
   wherein before outputting the first signal, each of the plurality of pixels outputs, as the analog signal, a first reset level signal based on a state where the voltage of the input node is reset,
   wherein before outputting the second signal, each of the plurality of pixels outputs, as the analog signal, a second reset level signal based on the state where the voltage of the input node is reset,
   wherein the control unit controls the gain applied to the first signal to be one of the first gain and the second gain in accordance with a signal value of the first signal, and
   wherein the control unit controls the gain applied to the second signal to be equal to the gain applied to the second reset level signal.

2. The image pickup device according to claim 1, wherein the control unit controls the gain applied to the second signal and the gain applied to the second reset level signal both to be the first gain.

3. The image pickup device according to claim 1, wherein the control unit controls the gain applied to the first reset level signal to be the second gain.

4. The image pickup device according to claim 1, wherein an image based on the first signals and an image based on the second signals are combined into an image.

5. The image pickup device according to claim 4, wherein when the images are combined into the image, a greater gain is applied to the second image than to the first image.

6. The image pickup device according to claim 1,
wherein the signal processing unit includes an analog-to-digital conversion unit configured to convert the analog signal into a digital signal, and
wherein the gain applied to the analog signal is a conversion gain used when the analog signal is converted into the digital signal.

7. The image pickup device according to claim 6, further comprising:
a memory unit including at least
a first memory configured to store a signal representing the gain applied to the analog signal, and
a second memory configured to store the digital signal,
wherein when the digital signal converted from the first signal is read, the signal and the digital signal are respectively read from the first memory and the second memory, and
wherein when the digital signal converted from the second signal is read, reading of the signal from the first memory is skipped.

8. The image pickup device according to claim 6, further comprising:
a memory unit including at least
a first memory configured to store a signal representing the gain applied to the analog signal, and
a second memory configured to store the digital signal,
wherein when the first signal is converted into a digital signal, the signal representing the gain applied to the analog signal is written in the first memory, and
wherein when the second signal is converted into a digital signal, writing of the signal in the first memory is skipped.

9. The image pickup device according to claim 6, further comprising:
a reference signal generation circuit configured to supply a reference signal to a comparison circuit included in the analog-to-digital conversion unit,
wherein the control unit changes an amount of change per unit time in a signal value of the reference signal supplied to the comparison circuit, in accordance with the signal value of the analog signal.

10. The image pickup device according to claim 1, wherein the first exposure period and the second exposure period are alternated.

11. An image pickup device comprising:
a plurality of pixels each configured to output an analog signal based on electric charges produced in a photoelectric conversion unit;
a control unit configured to control a gain applied to the analog signal to be at least a first gain and a second gain greater than the first gain in accordance with a signal value of the analog signal; and
a signal processing unit configured to process, by using a variable gain, the analog signal output from the pixel,
wherein each of the plurality of pixels outputs, as the analog signal, a first signal based on electric charges produced in the photoelectric conversion unit in a first exposure period and a second signal based on electric charges produced in the photoelectric conversion unit in a second exposure period shorter than the first exposure period,
wherein the control unit controls the gain applied to the analog signal by selecting one from the first gain and the second gain in accordance with the signal value, for at least one of the first signal and the second signal,
wherein the control unit controls, as the gain applied to the analog signal, the variable gain used by the signal processing unit to be at least the first gain and the second gain,
wherein each of the plurality of pixels includes
an amplification unit having an input node configured to receive the electric charges, and
a reset unit configured to reset voltage of the input node,
wherein before outputting the first signal, each of the plurality of pixels outputs, as the analog signal, a first reset level signal based on a state where the voltage of the input node is reset,
wherein before outputting the second signal, each of the plurality of pixels outputs, as the analog signal, a second reset level signal based on the state where the voltage of the input node is reset,
wherein the control unit selects the gain applied to the analog signal from at least the first gain and the second gain in accordance with a result of comparison between the signal value of the analog signal and a threshold,
wherein the control unit controls the gain applied to the first signal to be one of the first gain and the second gain in accordance with a result of the comparison performed for the first signal, and
wherein the control unit controls the gain applied to the second reset level signal and the gain applied to the second signal both to be one of the first gain and the second gain without performing the comparison for the second signal.

12. An image pickup device comprising:
a plurality of pixels each configured to output an analog signal based on electric charges produced in a photoelectric conversion unit;
a control unit configured to control a gain applied to the analog signal to be at least a first gain and a second gain greater than the first gain in accordance with a signal value of the analog signal; and
a signal processing unit configured to process, by using a variable gain, the analog signal output from the pixel,
wherein each of the plurality of pixels outputs, as the analog signal, a first signal based on electric charges produced in the photoelectric conversion unit in a first exposure period and a second signal based on electric charges produced in the photoelectric conversion unit in a second exposure period shorter than the first exposure period,
wherein the control unit controls the gain applied to the analog signal by selecting one from the first gain and the second gain in accordance with the signal value, for at least one of the first signal and the second signal,
wherein the control unit controls, as the gain applied to the analog signal, the variable gain used by the signal processing unit to be at least the first gain and the second gain,
wherein each of the plurality of pixels includes
an amplification unit having an input node configured to receive the electric charges, and
a reset unit configured to reset voltage of the input node,
wherein before outputting the first signal, each of the plurality of pixels outputs, as the analog signal, a first reset level signal based on a state where the voltage of the input node is reset, wherein before outputting the second signal, each of the plurality of pixels outputs, as the analog signal, a second reset level signal based on the state where the voltage of the input node is reset, wherein the control unit selects the gain applied to the analog signal from at least the first gain and the second gain in accordance with a result of comparison between the signal value of the analog signal and a threshold, wherein the control unit controls the gain applied to the first signal to be one of the first gain and the second gain in accordance with a result of the comparison performed for the first signal, and wherein the control unit controls the gain applied to the second reset level signal and the gain applied to the second signal both to be one of the first gain and the second gain regardless of a result of the comparison performed for the second signal.

13. The image pickup device according to claim 12, wherein the control unit includes a comparator configured to compare the signal value of the analog signal with the threshold, and a logic gate configured to receive a signal output from the comparator and a control signal for fixing an output.

14. An image pickup device comprising:

a plurality of pixels each configured to output an analog signal based on electric charges produced in a photoelectric conversion unit;

a control unit configured to control a gain applied to the analog signal to be at least a first gain and a second gain greater than the first gain in accordance with a signal value of the analog signal; and a signal processing unit configured to process, by using a variable gain, the analog signal output from the pixel, wherein each of the plurality of pixels outputs, as the analog signal, a first signal based on electric charges produced in the photoelectric conversion unit in a first exposure period and a second signal based on electric charges produced in the photoelectric conversion unit in a second exposure period shorter than the first exposure period, wherein the control unit controls the gain applied to the analog signal by selecting one from the first gain and the second gain in accordance with the signal value, for at least one of the first signal and the second signal, wherein the control unit controls, as the gain applied to the analog signal, the variable gain used by the signal processing unit to be at least the first gain and the second gain, wherein each of the plurality of pixels includes
an amplification unit having an input node configured to receive the electric charges, and
a reset unit configured to reset voltage of the input node, wherein before outputting the first signal, each of the plurality of pixels outputs, as the analog signal, a first reset level signal based on a state where the voltage of the input node is reset, wherein before outputting the second signal, each of the plurality of pixels outputs, as the analog signal, a second reset level signal based on the state where the voltage of the input node is reset, wherein the control unit controls the gain applied to the first signal to be one of the first gain and the second gain in accordance with a signal value of the first signal, and wherein before the second signal is output from the pixel, the control unit controls the gain applied to the second signal to be one of the first gain and the second gain.

15. An image pickup device comprising:

a plurality of pixels each configured to output an analog signal based on electric charges produced in a photoelectric conversion unit;

a control unit configured to control a gain applied to the analog signal to be at least a first gain and a second gain greater than the first gain in accordance with a signal value of the analog signal; and a signal processing unit configured to process, by using a variable gain, the analog signal output from the pixel, wherein each of the plurality of pixels outputs, as the analog signal, a first signal based on electric charges produced in the photoelectric conversion unit in a first exposure period and a second signal based on electric charges produced in the photoelectric conversion unit in a second exposure period shorter than the first exposure period, wherein the control unit controls the gain applied to the analog signal by selecting one from the first gain and the second gain in accordance with the signal value, for at least one of the first signal and the second signal, wherein the control unit controls, as the gain applied to the analog signal, the variable gain used by the signal processing unit to be at least the first gain and the second gain, wherein the signal processing unit includes an analog-to-digital conversion unit configured to convert the analog signal into a digital signal, and wherein the gain applied to the analog signal is a conversion gain used when the analog signal is converted into the digital signal, wherein the signal processing unit includes an amplification circuit configured to amplify the analog signal and to supply the amplified signal to a comparison circuit included in the analog-to-digital conversion unit, and wherein the control unit changes a gain of the amplification circuit in accordance with the signal value of the analog signal.

16. An image pickup device comprising:

a plurality of pixels each configured to output an analog signal based on electric charges produced in a photoelectric conversion unit; and a control unit configured to control a gain applied to the analog signal to be at least a first gain and a second gain greater than the first gain, wherein each of the plurality of pixels outputs, as the analog signal, a first signal based on electric charges produced in the photoelectric conversion unit in a first exposure period and a second signal based on electric charges produced in the photoelectric conversion unit in a second exposure period shorter than the first exposure period, and wherein the control unit
controls the gain applied to the first signal to be the first gain when a signal value of the first signal is in a first range,
controls the gain applied to the first signal to be the second gain when the signal value of the first signal is in a second range located on a lower luminance side than the first range, and
controls the gain applied to the second signal to be the first gain in the case when a signal value of the second signal is in the first range and in the case when the signal value of the second signal is in the second range.

17. The image pickup device according to claim 16, further comprising:
a signal processing unit configured to process, by using a variable gain, the analog signal output from the pixel,
wherein the control unit controls, as the gain applied to the analog signal, the variable gain used by the signal processing unit to be at least the first gain and the second gain.

18. The image pickup device according to claim 17,
wherein the signal processing unit includes an analog-to-digital conversion unit configured to convert the analog signal into a digital signal, and
wherein the gain applied to the analog signal is a conversion gain used when the analog signal is converted into the digital signal.

19. The image pickup device according to claim 18,
wherein the signal processing unit includes
an amplification circuit configured to amplify the analog signal and to supply the amplified signal to a comparison circuit included in the analog-to-digital conversion unit, and
wherein the control unit changes a gain of the amplification circuit in accordance with a signal value of the analog signal.

20. The image pickup device according to claim 18, further comprising:
a reference signal generation circuit configured to supply a reference signal to a comparison circuit included in the analog-to-digital conversion unit,
wherein the control unit changes an amount of change per unit time in a signal value of the reference signal supplied to the comparison circuit, in accordance with the signal value of the analog signal.

21. The image pickup device according to claim 16,
wherein each of the plurality of pixels includes
an amplification unit having an input node configured to receive the electric charges, and
a reset unit configured to reset voltage of the input node,
wherein before outputting the first signal, each of the plurality of pixels outputs, as the analog signal, a first reset level signal based on a state where the voltage of the input node is reset,
wherein before outputting the second signal, each of the plurality of pixels outputs, as the analog signal, a second reset level signal based on the state where the voltage of the input node is reset, and
wherein the control unit controls the gain applied to the second reset level signal to be the first gain.

22. The image pickup device according to claim 16, wherein an image based on the first signals and an image based on the second signals are combined into an image.

23. The image pickup device according to claim 22, wherein a greater gain is applied to the second image than to the first image.

24. An image pickup device comprising:
a plurality of pixels each configured to output an analog signal based on electric charges produced in a photoelectric conversion unit; and
a control unit configured to control a gain applied to the analog signal to be at least a first gain and a second gain greater than the first gain in accordance with a result of comparison between a signal value of the analog signal and a threshold,
wherein each of the plurality of pixels outputs, as the analog signal, a first signal based on electric charges produced in the photoelectric conversion unit in a first exposure period and a second signal based on electric charges produced in the photoelectric conversion unit in a second exposure period shorter than the first exposure period, and
wherein a threshold used in the comparison performed for the first signal is different from a threshold used in the comparison performed for the second signal.

25. The image pickup device according to claim 24, further comprising:
a signal processing unit configured to process, by using a variable gain, the analog signal output from the pixel,
wherein the control unit controls, as the gain applied to the analog signal, the variable gain used by the signal processing unit to be at least the first gain and the second gain.

26. The image pickup device according to claim 24,
wherein each of the plurality of pixels includes
an amplification unit having an input node configured to receive the electric charges, and
a reset unit configured to reset voltage of the input node,
wherein before outputting the first signal, each of the plurality of pixels outputs, as the analog signal, a first reset level signal based on a state where the voltage of the input node is reset,
wherein before outputting the second signal, each of the plurality of pixels outputs, as the analog signal, a second reset level signal based on the state where the voltage of the input node is reset, and
wherein the control unit controls the gain applied to the second reset level signal to be the first gain.

27. An image pickup device comprising:
a plurality of pixels each configured to output an analog signal based on electric charges produced in a photoelectric conversion unit;
an analog-to-digital conversion unit including a comparison circuit and configured to convert the analog signal into a digital signal; and
a reference signal generation circuit configured to supply a reference signal to the comparison circuit,
wherein each of the plurality of pixels outputs, as the analog signal, a first signal based on electric charges produced in the photoelectric conversion unit in a first exposure period and a second signal based on electric charges produced in the photoelectric conversion unit in a second exposure period shorter than the first exposure period, and
wherein when at least one of the first signal and the second signal is converted into the digital signal, an amount of change per unit time in a signal value of the reference signal supplied to the comparison circuit is changed in accordance with the signal value of the analog signal.

28. An image capturing system comprising:
the image pickup device according to claim 1; and
an image combining device configured to combine a first image based on the first signals and a second image based on the second signals to generate an image.

29. The image capturing system according to claim 28, wherein the image combining device applies a greater gain to the second image than to the first image.

30. A movable body comprising:
the image pickup device according to claim 1;
an image combining device configured to combine a first image based on the first signals and a second image based on the second signals to generate an image; and a control device configured to control the movable body based on a processing result of the generated image.

31. The movable body according to claim 30, wherein the image combining device applies a greater gain to the second image than to the first image.

32. An image capturing system comprising:
   the image pickup device according to claim 16; and
   an image combining device configured to combine a first image based on the first signals and a second image based on the second signals to generate an image.

33. The image capturing system according to claim 32, wherein the image combining device applies a greater gain to the second image than to the first image.

34. A movable body comprising:
   the image pickup device according to claim 16;
   an image combining device configured to combine a first image based on the first signals and a second image based on the second signals to generate an image; and
   a control device configured to control the movable body based on a processing result of the generated image.

35. The movable body according to claim 34, wherein the image combining device applies a greater gain to the second image than to the first image.

* * * * *